United States Patent
Seong et al.

(10) Patent No.: US 10,692,933 B2
(45) Date of Patent: Jun. 23, 2020

(54) VARIABLE RESISTANCE MEMORY DEVICE

(71) Applicant: SAMSUNG ELECTRONICS CO., LTD., Suwon-si, Gyeonggi-Do (KR)

(72) Inventors: Dong-Jun Seong, Seongnam-si (KR); Yong-Jin Park, Seoul (KR); Jun-Hwan Paik, Hwaseong-si (KR); Gyu-Hwan Oh, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/359,146

(22) Filed: Mar. 20, 2019

(65) Prior Publication Data
US 2020/0066799 A1 Feb. 27, 2020

(30) Foreign Application Priority Data
Aug. 23, 2018 (KR) .......................... 10-2018-0098297

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1233* (2013.01); *H01L 45/1253* (2013.01); *H01L 45/1616* (2013.01)

(58) Field of Classification Search
CPC ............. H01L 27/2463; H01L 27/2427; H01L 45/1233; H01L 45/1253
See application file for complete search history.

(56) References Cited

U.S. PATENT DOCUMENTS

| | | | |
|---|---|---|---|
| 7,411,208 B2 | 8/2008 | Hwang et al. | |
| 7,554,147 B2 | 6/2009 | Asano et al. | |
| 8,187,918 B2 | 5/2012 | Oh et al. | |
| 8,455,985 B2 | 6/2013 | Han et al. | |
| 9,093,389 B2 | 7/2015 | Nemani et al. | |
| 10,056,431 B2 * | 8/2018 | Park ..................... | H01L 45/06 |
| 10,403,817 B2 * | 9/2019 | Song .................... | H01L 27/2427 |
| 10,504,960 B2 * | 12/2019 | Park .................... | H01L 21/7685 |
| 2013/0214411 A1 | 8/2013 | Kim et al. | |
| 2017/0356084 A1 | 12/2017 | Nakanishi et al. | |
| 2019/0067569 A1 * | 2/2019 | Kang .................. | H01L 27/2463 |

FOREIGN PATENT DOCUMENTS

KR 10-0479816 3/2005

* cited by examiner

*Primary Examiner* — Allison Bernstein
(74) *Attorney, Agent, or Firm* — F. Chau & Associates, LLC

(57) ABSTRACT

A variable resistance memory device may include a first conductive line, a plurality of stacked structures, and a mold pattern. The first conductive line may be formed on a substrate. The plurality of stacked structures may be formed on the first conductive line, and each of the plurality of stacked structures includes a lower electrode, a variable resistance pattern, and a middle electrode stacked on one another. The mold pattern may be formed on the first conductive line to fill a space between the plurality of stacked structures. An upper portion of the mold pattern may include a surface treated layer and a lower portion of the mold pattern may include a non-surface treated layer.

20 Claims, 25 Drawing Sheets

VARIABLE RESISTANCE MEMORY DEVICE

CROSS-REFERENCE TO RELATED APPLICATION

This application claims priority under 35 U.S.C. § 119 to Korean Patent Application No. 10-2018-0098297, filed on Aug. 23, 2018 in the Korean Intellectual Property Office (KIPO), the disclosure of which is incorporated by reference herein in its entirety.

TECHNICAL FIELD

Exemplary embodiments of the inventive concept relate to a variable resistance memory device and a method of manufacturing the same. More particularly, exemplary embodiments of the inventive concept relate to a variable resistance memory device having stacked cross-point array structures and methods of manufacturing the same.

DISCUSSION OF RELATED ART

As memory devices become highly integrated, variable resistance memory devices having vertically stacked cross-point array structures have been manufactured.

SUMMARY

According to an exemplary embodiment of the inventive concept, a variable resistance memory device may include a first conductive line, a plurality of stacked structures, and a mold pattern. The first conductive line may be formed on a substrate. The plurality of stacked structures may be formed on the first conductive line, and each of the plurality of stacked structures includes a lower electrode, a variable resistance pattern, and a middle electrode stacked on one another. The mold pattern may be formed on the first conductive line to fill a space between the plurality of stacked structures. An upper portion of the mold pattern may include a surface treated layer and a lower portion of the mold pattern may include a non-surface treated layer.

According to an exemplary embodiment of the inventive concept, a variable resistance memory device may include a plurality of stacked structures, a mold pattern, and a selection pattern. The plurality of stacked structures may include a lower electrode, a variable resistance pattern, and a middle electrode stacked on one another, and each of the plurality of stacked structures may have a U-shape. The mold pattern may fill a space between the plurality of stacked structures. The selection pattern may be formed on the middle electrode of each of the plurality of stacked structures. An upper portion of the mold pattern may include a surface treated layer and a lower portion of the mold pattern may include a non-surface treated layer.

According to an exemplary embodiment of the inventive concept, a variable resistance memory device may include a plurality of first conductive lines, a plurality of stacked structures, a mold pattern, a selection pattern, and a second conductive line. The plurality of first conductive lines may be formed on a substrate, and may extend in a first direction parallel with an upper surface of the substrate. The plurality of stacked structures may be formed on the plurality of first conductive lines, and may each include a lower electrode, a variable resistance pattern, and a middle electrode stacked on one another. The mold pattern may be formed on the plurality of first conductive lines to fill a space between the plurality of stacked structures. An upper portion of the mold pattern may include a surface treated layer and a lower portion of the mold pattern may include a non-surface treated layer. The selection pattern may be formed on the middle electrode of each of the plurality of stacked structures. The second conductive line may be formed on the selection pattern, and may extend a direction perpendicular to the first direction.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
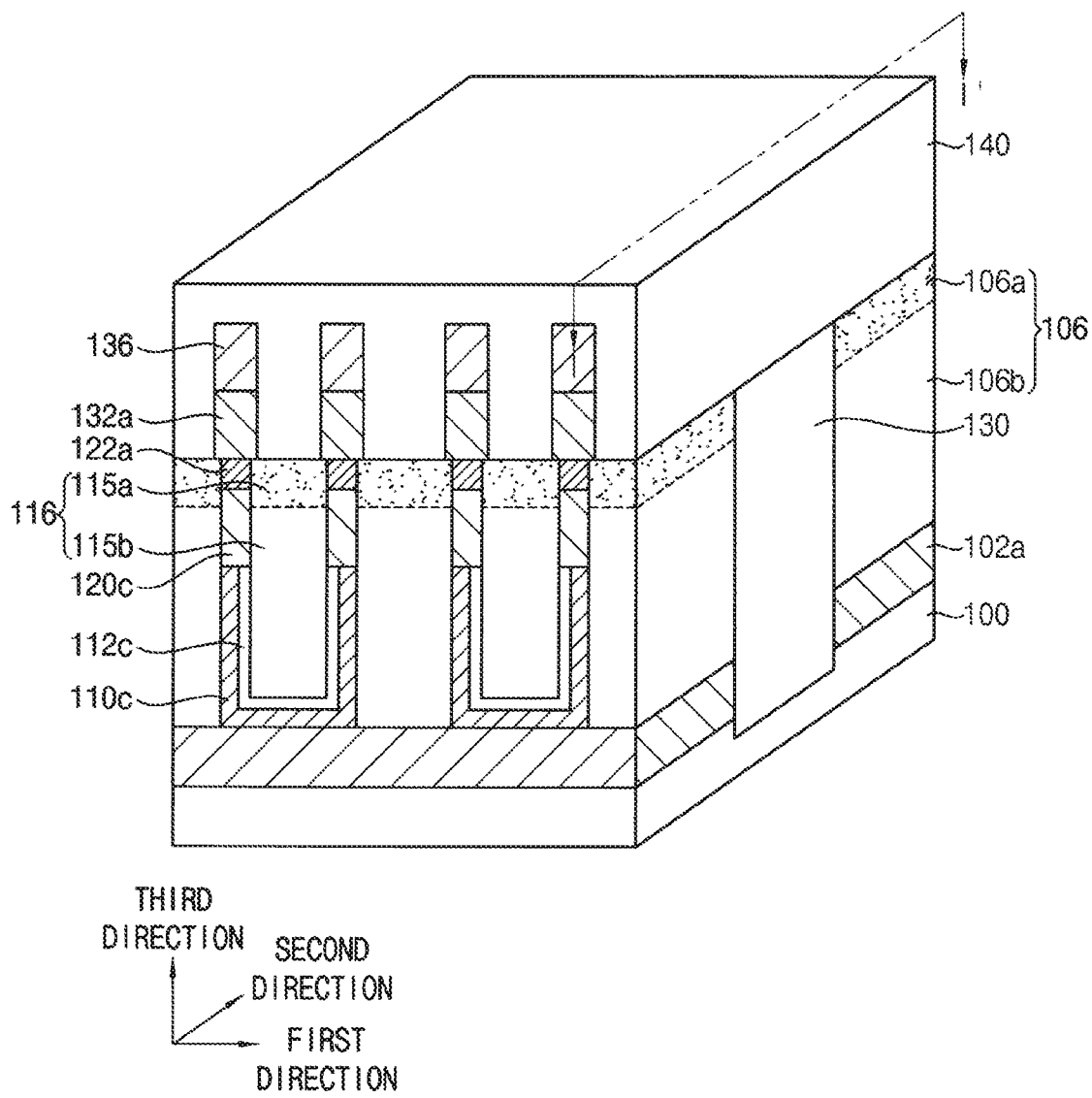
FIG. 1 is a perspective view illustrating a variable resistance memory device according to an exemplary embodiment of the inventive concept.

Exemplary embodiments of the inventive concept provide a variable resistance memory device.

Exemplary embodiments of the inventive concept will be described more fully hereinafter with reference to the accompanying drawings. Like reference numerals may refer to like elements throughout this application.

Figure 2:
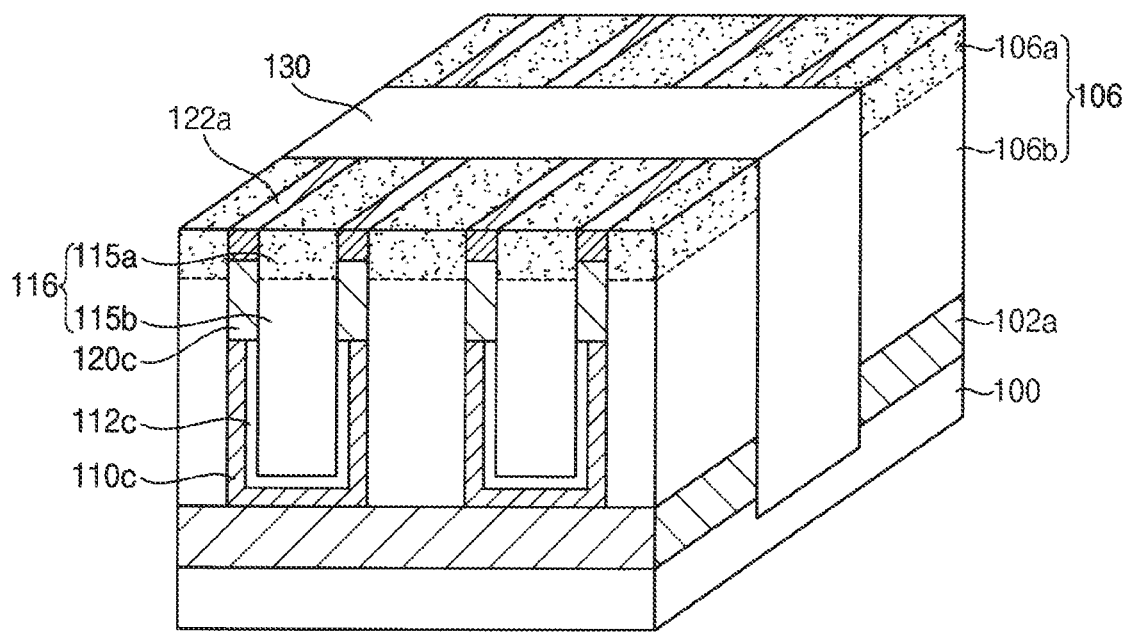
FIG. 2 is a perspective view illustrating a portion of a variable resistance memory device according to an exemplary embodiment of the inventive concept.
Figure 2:
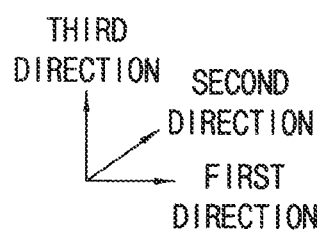
Figure 3:
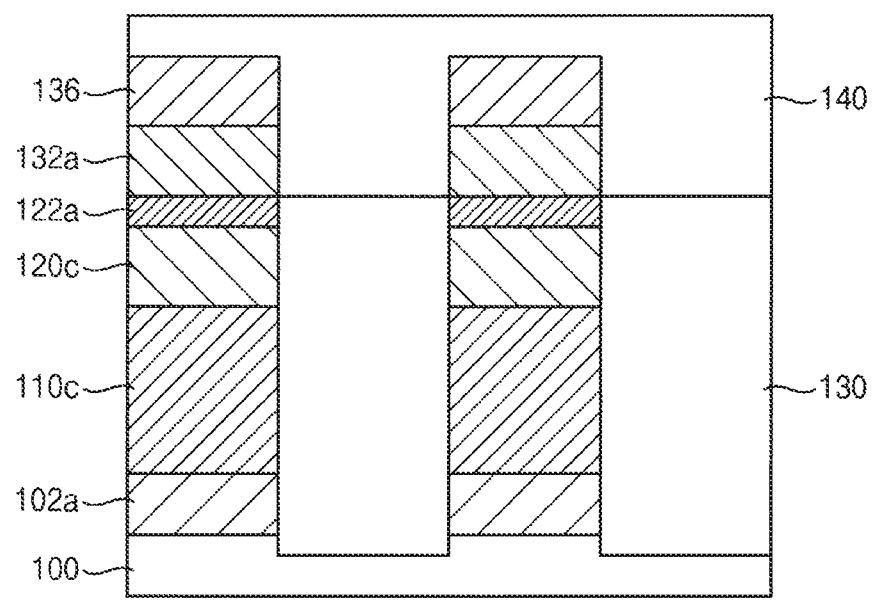
FIG. 3 is a cross-sectional view illustrating a portion of a variable resistance memory device according to an exemplary embodiment of the inventive concept.
Figure 3:
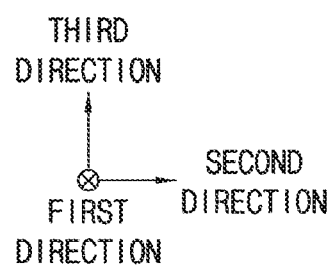

FIG. 1 is a perspective view illustrating a variable resistance memory device according to an exemplary embodiment of the inventive concept. FIG. 2 is a perspective view illustrating a portion of a variable resistance memory device according to an exemplary embodiment of the inventive concept. FIG. 3 is a cross-sectional view illustrating a portion of a variable resistance memory device according to an exemplary embodiment of the inventive concept. Specifically, FIG. 3 is a cross-sectional view taken along the line I-I' of FIG. 1.

Referring to FIGS. 1 to 3, the variable resistance memory device may include a first conductive line 102a, a variable resistance memory cell, and a second conductive line 136. The variable resistance memory device may be formed on a substrate 100.

The first conductive line 102a may extend in a first direction parallel to an upper surface of the substrate 100. The second conductive line 136 may extend in a second direction parallel to the upper surface of the substrate 100 and perpendicular to the first direction. The first and second conductive lines 102a and 136 may be spaced apart from each other in a third direction perpendicular to the upper surface the substrate 100.

The variable resistance memory cell may be positioned at a cross point of the first conductive line 102a and the second conductive line 136. The variable resistance memory cell may contact an upper surface of the first conductive line 102a and a lower surface of the second conductive line 136.

The substrate 100 may include a semiconductor substrate, e.g., a silicon substrate, a germanium substrate, a silicon-germanium substrate, a silicon-on-insulator (SOI) substrate, or a germanium-on-insulator (GOI) substrate, etc. The substrate 100 may include III-V compounds, e.g., GaP, GaAs, GaSb, etc. An upper portion of the substrate 100 may include well regions doped with p-type or n-type impurities.

In exemplary embodiments of the inventive concept, an insulation layer may be further formed on the substrate 100. Thus, the first conductive line 102a may be formed on the insulation layer. In exemplary embodiments of the inventive concept, a peripheral circuit including a transistor, a contact plug, a wiring, etc., may be formed on the substrate 100. A lower insulation layer may be formed on the substrate 100 to at least cover the peripheral circuit.

The first conductive line 102a may include a metal or a metal nitride such as copper, aluminum, tungsten, cobalt, titanium, tantalum, titanium nitride (TiNx), tungsten nitride (WNx), tantalum nitride (TaNx), etc.

The variable resistance memory cell may include a lower electrode 110c, a variable resistance pattern 120c, a middle electrode 122a, and a selection pattern 132a sequentially stacked. The variable resistance memory cell may be formed on the first conductive line 102a, and may have a pillar shape.

In exemplary embodiments of the inventive concept, the variable resistance memory cell may further include an upper electrode stacked on the selection pattern 132a.

The lower electrode 110c may contact the upper surface of the first conductive line 102a. In exemplary embodiments of the inventive concept, the lower electrode 110c may have a U-shape, in a cross-sectional view taken along the first direction. Thus, a protruding portion of the U-shaped structure may extend in the second direction. The lower electrode 110c may serve as a heating electrode, so that joule heat may be generated by the lower electrode 110c.

The lower electrode 110c may include a metal nitride or a metal silicon nitride having a resistance higher than a resistance of the first conductive line 102a. For example, the lower electrode 110c may include, e.g., titanium nitride, titanium silicon nitride, tungsten nitride, tungsten silicon nitride, tantalum nitride, tantalum silicon nitride, zirconium nitride, zirconium silicon nitride, etc.

In exemplary embodiments of the inventive concept, an insulation liner 112c may be formed on the lower electrode 110c. The insulation liner 112c may be conformally formed on an inner surface of the lower electrode 110c having the U-shape. Thus, the insulation liner 112c may also have a U-shape. The insulation liner 112c may include, e.g., silicon oxide.

The variable resistance pattern 120c may protrude from an uppermost end in the third direction of the lower electrode 110c. Thus, variable resistance patterns 120c may be formed on two uppermost surfaces of the lower electrode 110c facing each other. Each of the variable resistance patterns 120c may be formed on the lower electrode 110c, and may extend in the second direction. Thus, a stacked structure including the lower electrode 110c and the variable resistance patterns 120c may have a U-shape, in a cross-sectional view taken along the first direction.

In other words, two variable resistance patterns 120c may be formed on the lower electrode 110c. Thus, two variable resistance memory cells may be formed on one lower electrode 110c.

In exemplary embodiments of the inventive concept, a width in the first direction of the variable resistance pattern 120c may be greater than a width in the first direction of the lower electrode 110c. For example, the width in the first direction of the variable resistance pattern 120c may be substantially the same as a sum of the width in the first direction of the lower electrode 110c and a width in the first direction of the insulation liner 112c.

As the stacked structure including the lower electrode 110c and the variable resistance pattern 120c may have a U shape, a contact area between the lower electrode 110c and the variable resistance pattern 120c may decrease. Thus, a heat transfer efficiency from the lower electrode 110c to the variable resistance pattern 120c may increase.

The variable resistance pattern 120c may include a phase change material that can be a phase transition between an amorphous state and a crystalline state due to the joule heat transferred from the lower electrode 110c. A resistance of the variable resistance pattern 120c may be changed by the phase transition of the variable resistance pattern 120c, and thus the variable resistance memory cell may be a set state or a reset state. In this case, the variable resistance memory cell may be used in a phase-change random access memory (PRAM) device.

In exemplary embodiments of the inventive concept, the phase change material may include GST materials in which germanium (Ge), antimony (Sb), and/or tellurium (Te) may be combined at a predetermined ratio. In exemplary embodiments of the inventive concept, the variable resistance pattern 120c may have a super lattice structure including a GeTe layer and an SbTe layer alternatively stacked. The variable resistance pattern 120c may include In—Sb—Te (IST) materials or Bi—Sb—Te (BST) materials.

In exemplary embodiments of the inventive concept, the variable resistance pattern 120c may include a material whose resistance may be changed by a magnetic field or a spin transfer torque (STT). For example, the variable resistance pattern 120c may include a ferromagnetic material, e.g., iron (Fe), nickel (Ni), cobalt (Co), dysprosium (Dy), gadolinium (Gd), or the like. In this case, the variable resistance memory cell may be used in a magnetic random access memory (MRAM) device.

In exemplary embodiments of the inventive concept, the variable resistance pattern 120c may include a perovskite-based material or a transition metal oxide. The perovskite-based material may include, e.g., STO ($SrTiO_3$), BTO ($BaTiO_3$), PCMO ($Pr_{1-x}Ca_xMnO_3$), or the like. The transition metal oxide may include, e.g., zirconium oxide (ZrOx), hafnium oxide (HfOx), aluminum oxide (AlOx), etc. In this case, the variable resistance memory cell may be used in a resistive random access memory (ReRAM) device.

The middle electrode 122a may be formed on each of the variable resistance patterns 120c. The middle electrode 122a may extend in the second direction. Thus, the first stacked structure including the lower electrode 110c, the variable resistance pattern 120c, and the middle electrode 122a stacked may have a U-shape, in a cross-sectional view taken along the first direction.

The middle electrode 122a may include a metal nitride or a metal silicon nitride. For example, the middle electrode 122a may include, e.g., titanium nitride, titanium silicon nitride, tungsten nitride, tungsten silicon nitride, tantalum nitride, tantalum silicon nitride, zirconium nitride, zirconium silicon nitride, etc.

A plurality of first stacked structures may be on the first conductive line 102a. Additionally, the first stacked structures may be arranged in the first direction and the second direction.

A first mold pattern 106 may be formed between outerwalls in the first direction of the first stacked structure. The first mold pattern 106 may include silicon nitride. A second mold pattern 116 may fill an inner space of the first stacked structure having the U-shape. The second mold pattern 116 may include silicon nitride.

A merged structure including the first stacked structure and the first and the second mold patterns 106 and 116 may be formed on the first conductive line 102a, and may extend in the first direction Upper portions of the first mold pattern 106 and the second mold pattern 116 may include a surface treated layer by performing a surface treatment. Additionally, lower portions of the first mold pattern 106 and the second mold pattern 116 include a non-surface treated layer without performing a surface treatment. Thus, the upper portion of the first mold pattern 106 may have a hardness different from a hardness of the lower portion of the first mold pattern 106. Additionally, the upper portion of the second mold pattern 116 may have hardness different from a hardness of the lower portion of the second mold pattern 116. In other words, the upper portions of the first and second mold patterns 106 and 116 may have hardnesses greater than hardnesses of the lower portions of the first and second mold patterns 106 and 116, respectively.

For example, the upper portions of the first and second mold patterns 106 and 116 may include a first silicon nitride 106a and 115a, respectively, by performing a surface treatment. The first and second mold patterns 106 and 116 may also include a second silicon nitride 106b and 115b, respectively, without performing a surface treatment. The first silicon nitride 106a and 115a may have a hardness greater than a hardness of the second silicon nitride 106b and 115b.

Additionally, the first silicon nitride 106a and 115a may have a polishing selectivity and a polishing tolerance greater than those of the second silicon nitride 106b and 115b. For example, the first silicon nitride 106a and 115a may be hardly removed during a polishing process of a variable resistance layer.

In exemplary embodiments of the inventive concept, the upper portions of the first and second mold patterns 106 and 116 may include the first silicon nitride 106a and 115a modified by performing a low-temperature plasma treatment. The lower portions of the first and second mold patterns 106 and 116 may include the second silicon nitride 106b and 115b without performing the low-temperature plasma treatment. For example, the first silicon nitride 106a and 115a may include defects and dangling bonds less than those included in the second silicon nitride 106b and 115b.

In exemplary embodiments of the inventive concept, the first silicon nitride 106a and 115a may further include gases used for the plasma treatment. Thus, when components of the first silicon nitride 106a and 115a are analyzed, a peak value of the components of the gases used for the plasma treatment in the first silicon nitride 106a, 115a may be detected. The gases used for the plasma treatment may include argon, hydrogen, helium, etc.

In exemplary embodiments of the inventive concept, the upper portions of the first and second mold patterns 106 and 116 may include the first silicon nitride 106a and 115a modified by an ion doping process. The lower portions of the first and second mold patterns 106 and 116 may include the second silicon nitride 106b and 115b without doped ions.

In exemplary embodiments of the inventive concept, the first silicon nitride 106a and 115a may include ions used for the doping process. Thus, when components of the first silicon nitride 106a and 115a are analyzed, a peak value of the components of the ions in the first silicon nitride 106a and 115a may be detected. The ions used for the doping process may include silicon ions.

In exemplary embodiments of the inventive concept, the first silicon nitride 106a and 115a may have a thickness so that a portion thereof may remain after the polishing process of the variable resistance layer. In exemplary embodiments of the inventive concept, the first silicon nitride 106a and 115a may have a thickness of about 100 Å to about 400 Å downward from an upper surface of the first and second mold patterns 106 and 116. In exemplary embodiments of the inventive concept, the first silicon nitride 106a and 115a may be positioned higher than a top surface of the lower electrode 110c.

In exemplary embodiments of the inventive concept, the first silicon nitride 106a and 115a may be opposite to at least portions of a sidewall of the middle electrode 122a. In exemplary embodiments of the inventive concept, the first silicon nitride 106a and 115a may be opposite to a sidewall of the middle electrode 122a and at least portions of a sidewall of the variable resistance pattern 120c.

A first sidewall of the variable resistance pattern 120c may contact the first mold pattern 106, and a second sidewall facing the first sidewall of the variable resistance pattern 120c may contact the second mold pattern 116. A recess may be defined by one sidewall of the first mold pattern 106, one sidewall of the second mold pattern 116, and top surfaces of the lower electrode 110c and the insulation liner 112c. A longitudinal direction of the recess may be the second direction. The variable resistance pattern 120c and the middle electrode 122a may be formed in the recess.

A filling insulation layer 130 may be formed between the first conductive lines 102a in the second direction and between the merged structures including the first stacked structure and the first and second mold patterns 106 and 116 in the second direction. The filling insulation layer 130 may be formed on the substrate 100, and may extend in the first direction. The filling insulation layer 130 may include, e.g., silicon nitride or silicon oxide. The filling insulation layer 130 may be a layer without performing a low-temperature plasma treatment or ion doping process.

Upper surfaces of the first stacked structure, the first and second mold patterns 106 and 116, and the filling insulation layer 130 may be coplanar with one another, and may be substantially flat.

The selection pattern 132a may contact an upper surface of the middle electrode 122a. The selection pattern 132a may have a pillar shape. The selection pattern 132a may serve as a switch element.

In exemplary embodiments of the inventive concept, the selection pattern 132a may include a chalcogenide-based ovonic threshold switch (OTS) material. In an exemplary embodiment of the inventive concept, the selection pattern 132a may include arsenic (As), and may further include at least two of silicon (Si), germanium (Ge), antimony (Sb), tellurium (Te), selenium (Se), indium (In), and tin (Sn). In an exemplary embodiment of the inventive concept, the selection pattern 132a may include Se, and may further include at least two of As, Si, Ge, Sb, Te, In, and Sn.

In an exemplary embodiment of the inventive concept, the selection pattern 132a may include a compound of 5 components such as AsTeGeSiIn, or a compound of 6 components such as AsTeGeSiSbS. In an exemplary embodiment of the inventive concept, the selection pattern 132a may further include dopants, e.g., carbon, boron, oxygen, nitrogen, sulfur, and/or phosphorus.

A first insulation pattern 134a (see FIG. 16) may be formed to fill a space between the selection patterns 132a in the second direction. The first insulation pattern 134a may include silicon nitride or silicon oxide. A structure including the selection pattern 132a and the first insulation pattern 134a may extend in the second direction.

The second conductive line 136 may be formed on the selection pattern 132a and the first insulation pattern 134a. The second conductive line 136 may include a metal or metal nitride, e.g., copper, aluminum, tungsten, cobalt, titanium, tantalum, titanium nitride (TiNx), tungsten nitride (WNx), tantalum nitride (TaNx), etc.

The structure including the selection pattern 132a and the first insulation pattern 134a and the second conductive line may be sequentially stacked, and may extend in the second direction. A second insulation layer 140 may be formed on the second conductive line 136 to fill a space between the second conductive lines 136. The second insulation layer 140 may include silicon nitride or silicon oxide.

In exemplary embodiments of the inventive concept, the first insulation pattern 134a may include a material substantially the same as a material of the second insulation layer 140.

As described above, in the variable resistance memory device according to exemplary embodiments of the inventive concept, the variable resistance memory cells may be formed at cross points of the first conductive lines 102a and the second conductive lines 136.

FIGS. 4 to 17 are perspective views illustrating stages of a method of manufacturing a variable resistance memory device according to an exemplary embodiment of the inventive concept.

Figure 4:
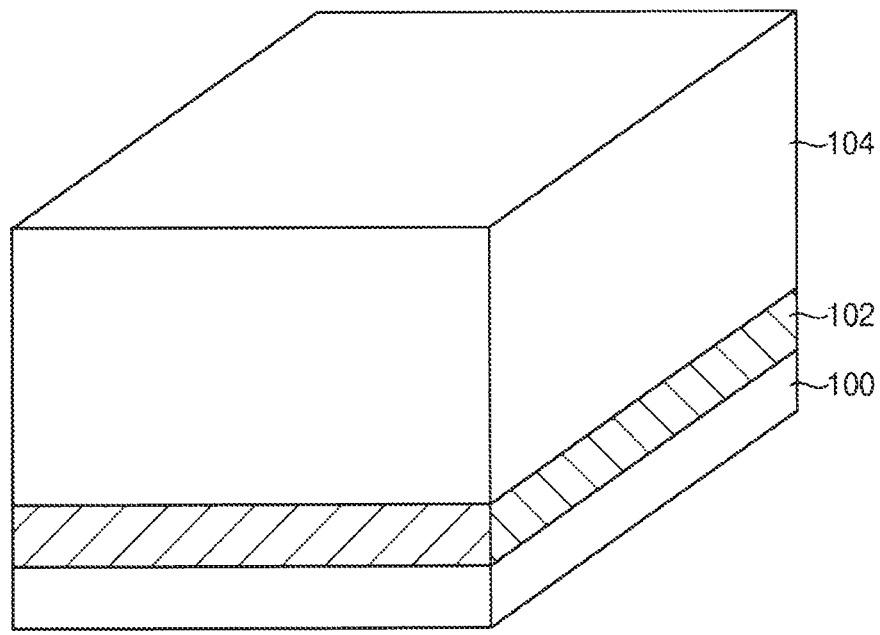
FIGS. 4 to 17 are perspective views illustrating stages of a method of manufacturing a variable resistance memory device according to an exemplary embodiment of the inventive concept.
Figure 4:
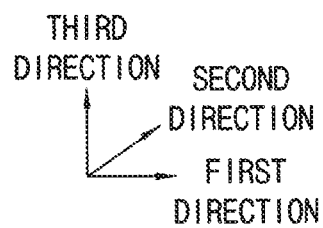

Referring to FIG. 4, a first conductive layer 102 and a first mold layer 104 may be sequentially formed on the substrate 100.

The first conductive layer 102 and the first mold layer 104 may be formed by a physical vapor deposition (PVD) process, a sputtering process, or a chemical vapor deposition (CVD) process.

The first conductive layer 102 may include a metal or metal nitride, e.g., copper, aluminum, tungsten, cobalt, titanium, tantalum, titanium nitride (TiNx), tungsten nitride (WNx), tantalum nitride, etc. The first mold layer 104 may include, e.g., silicon nitride.

The first mold layer 104 may serve as portions for forming a lower electrode, a variable resistance pattern, and a middle electrode. Thus, the first mold layer 104 may be formed to have a height equal to or higher than a height of a first stacked structure including the lower electrode, the variable resistance pattern, and the middle electrode.

Figure 5:
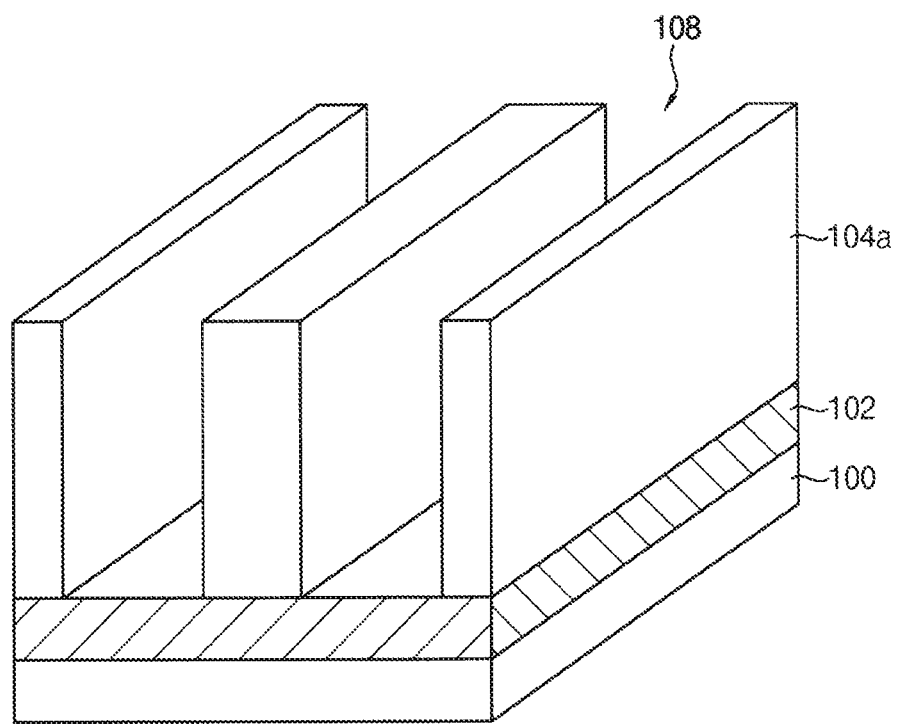

Referring to FIG. 5, the first mold layer 104 may be partially etched to form first preliminary mold patterns 104a extending in the second direction.

A first trench 108 may be formed between the first preliminary mold patterns 104a, and the first trench 108 may extend in the second direction. The first conductive layer 102 may be exposed by a bottom of the first trench 108.

Figure 6:
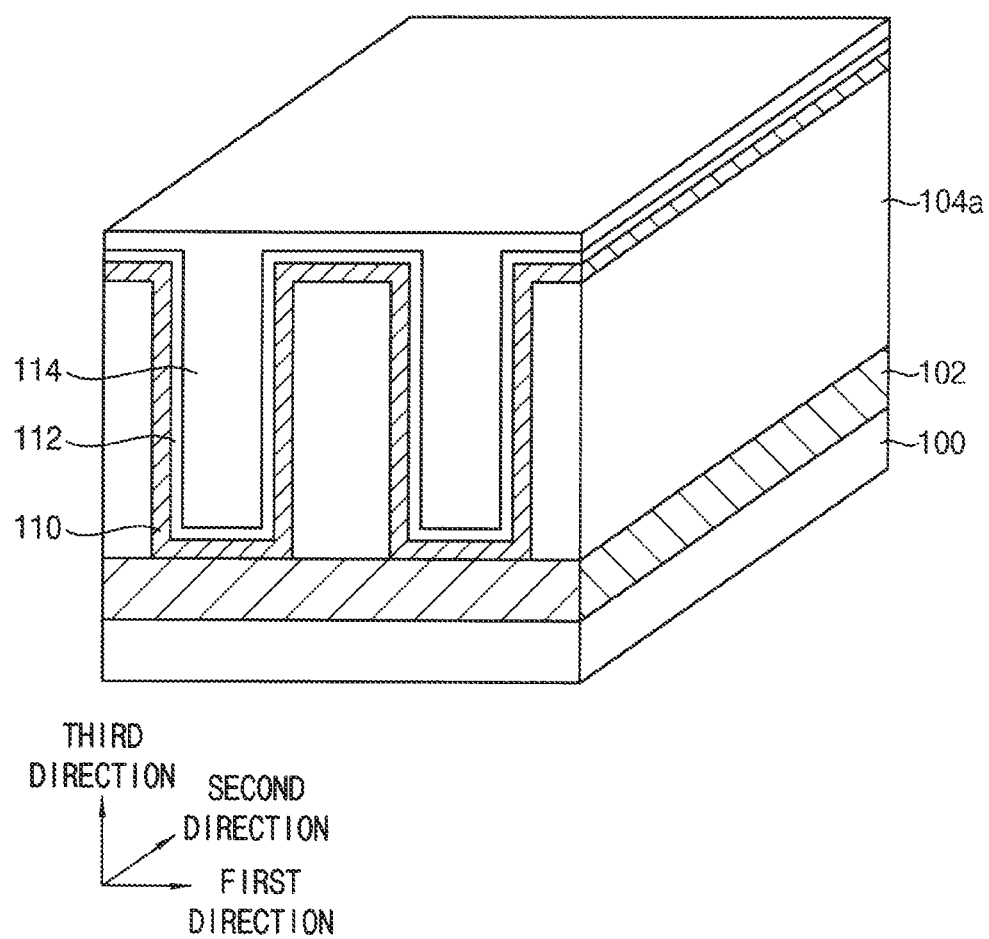

Referring to FIG. 6, a lower electrode layer 110 and an insulation liner layer 112 may be sequentially and conformally formed on a surface of the first trench 108 and upper surfaces of the first preliminary mold patterns 104a. A second mold layer 114 may be formed on the insulation liner layer 112 to sufficiently fill an inner space of the first trench 108.

The lower electrode layer 110, the insulation liner layer 112, and the second mold layer 114 may be formed by e.g., an atomic layer deposition (ALD) process or a chemical vapor deposition (CVD) process.

The lower electrode layer 110 may be formed to include a metal nitride or a metal silicon nitride having a resistance higher than a resistance of the first conductive layer 102. For example, the lower electrode layer 110 may include, e.g., titanium nitride, titanium silicon nitride, tungsten nitride, tungsten silicon nitride, tantalum nitride, tantalum silicon nitride, zirconium nitride, zirconium silicon nitride, etc. The insulation liner layer 112 may include e.g., silicon oxide. The second mold layer 114 may include, e.g., silicon nitride. In other words, the first preliminary mold pattern 104a and the second mold layer 114 may include the same insulation material.

Figure 7:
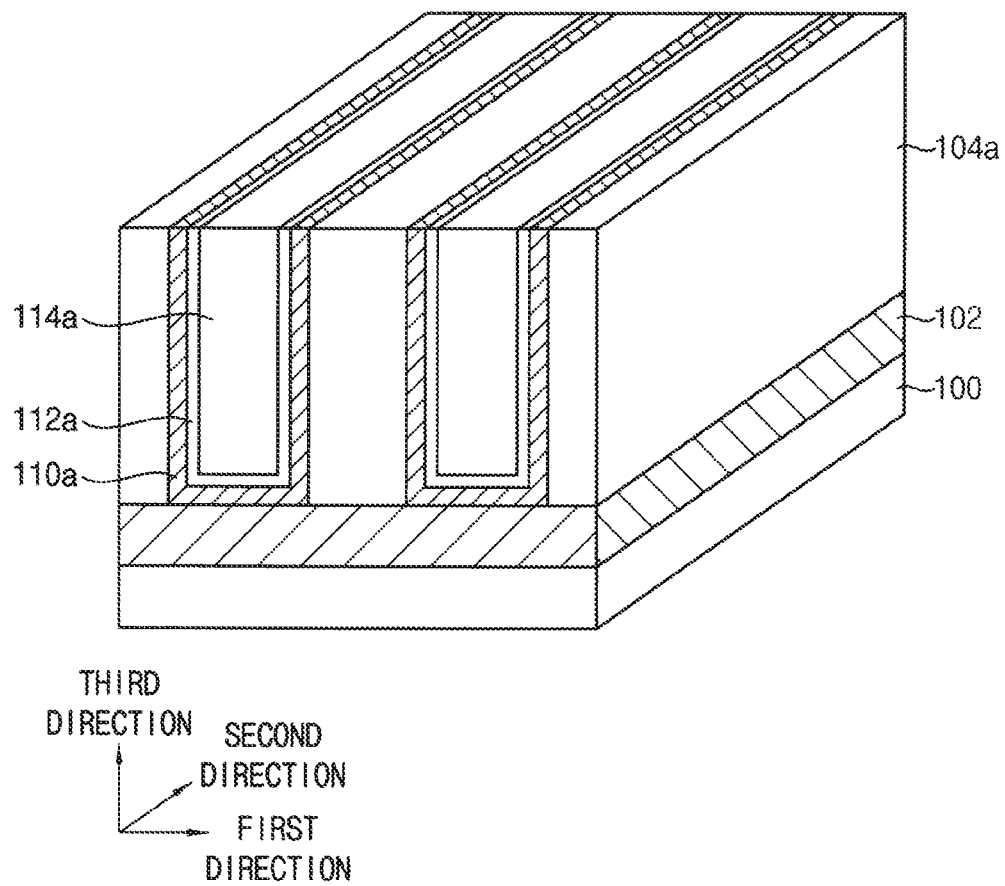

Referring to FIG. 7, the second mold layer 114, the insulation liner layer 112, and the lower electrode layer 110 may be planarized until the upper surface of the first preliminary mold pattern 104a may be exposed to form a second preliminary mold pattern 114a, a first preliminary insulation liner 112a, and a first preliminary lower electrode 110a in the first trench 108, respectively.

The planarization process may include, e.g., a chemical mechanical polishing (CMP) process. When the planarization process is performed, upper surfaces of the first and second preliminary mold patterns 104a and 114a, the first preliminary insulation liner 112a, and the first preliminary lower electrode 110a may be exposed.

Figure 8:
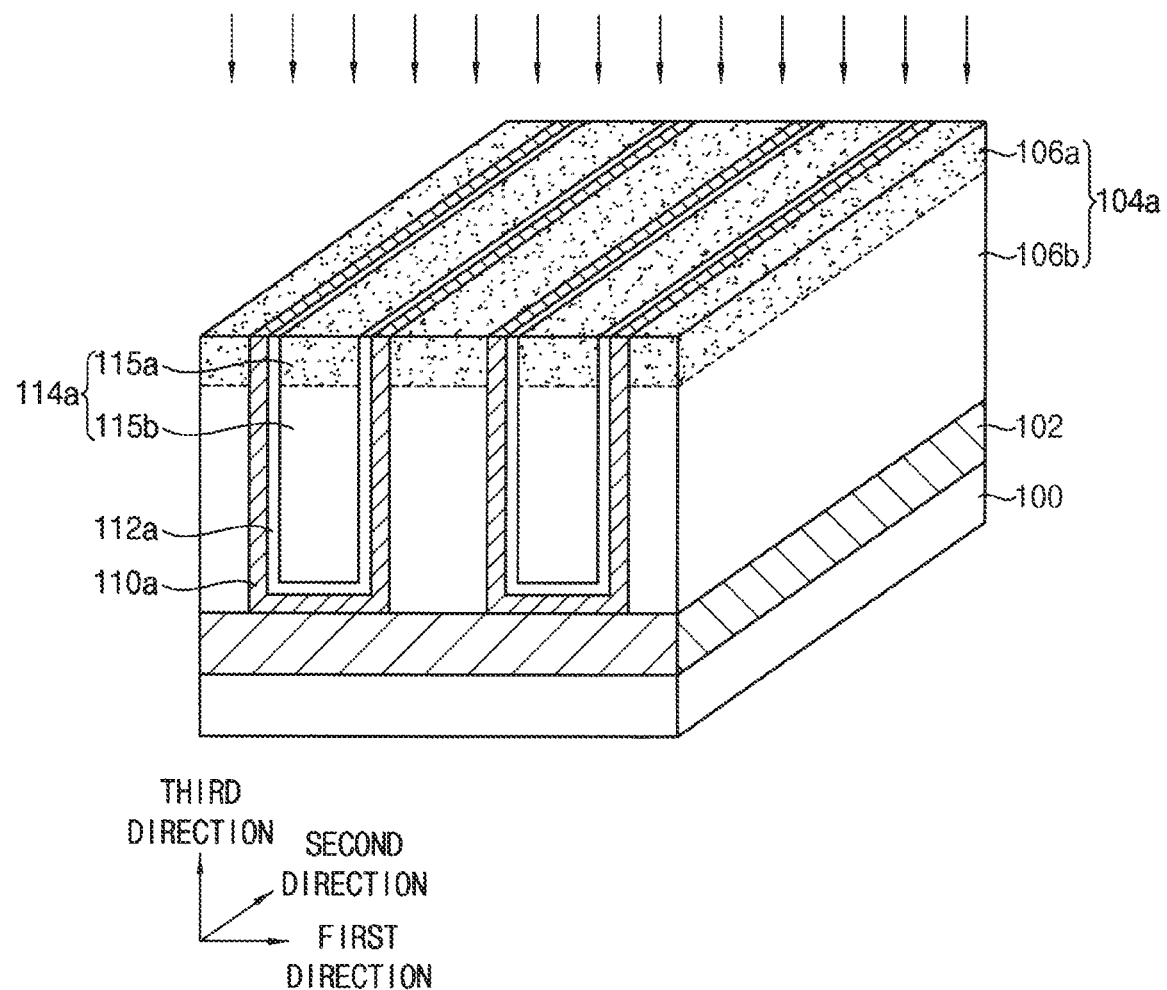

Referring to FIG. 8, a surface treatment process may be performed to harden upper portions of the first and second preliminary mold patterns 104a and 114a.

For example, the upper portions of the first and second preliminary mold patterns 104a and 114a include the first silicon nitride 106a and 115a modified by the surface treatment process. Lower portions of the first and second preliminary mold patterns 104a and 114a may include the second silicon nitride 106b and 115b without performing the surface treatment process. Defects and dangling bonds included in the upper portions of the first and second preliminary mold patterns 104a and 114a may be cured or removed by the surface treatment process. Thus, the first silicon nitride 106a and 115a may have a hardness greater than a hardness of the second silicon nitride 106b and 115b. Additionally, the first silicon nitride 106a and 115a may have a polishing selectivity and an etching selectivity higher than those of the second silicon nitride 106b and 115b.

In exemplary embodiments of the inventive concept, the first silicon nitride 106a and 115a may have a thickness so that a portion of the first silicon nitride 106a and 115a may remain after a subsequent polishing process of a variable resistance layer. Thus, the first silicon nitride 106a and 115a may not be completely consumed, and a shape of the first silicon nitride 106a and 115a may remain. Further, the first silicon nitride 106a and 115a may have a thickness so that a portion of the first silicon nitride 106a and 115a may remain after a subsequent partial etching process of the first preliminary insulation liner.

In exemplary embodiments of the inventive concept, the first silicon nitride 106a and 115a may have a thickness of about 100 Å to about 400 Å downward from the upper surfaces of the first and second mold patterns 106 and 116. In exemplary embodiments of the inventive concept, the first silicon nitride 106a and 115a may be positioned higher than a top surface of a lower electrode that is subsequently formed.

In exemplary embodiments of the inventive concept, the surface treatment process may include a low-temperature plasma treatment or an ion doping process. The surface treatment process may be performed at a temperature at which thermal damage may not be generated to elements or layers thereunder.

For example, the low-temperature plasma process may be performed on the upper surfaces of the first and second preliminary mold patterns 104a and 114a, the first preliminary insulation liner 112a, and the first preliminary lower electrode 110a.

The low-temperature plasma process may be performed at a temperature of about 100° C. to 300° C. In the low-temperature plasma process, a gas, e.g., argon, hydrogen, or helium may be used. When the low-temperature plasma process is performed, the first silicon nitride 106a and 115a may be formed at the upper portions of the first and second preliminary mold patterns 104a and 114a. Additionally, the first silicon nitride 106a and 115a may further include the gas used for the plasma treatment of the low-temperature plasma process, e.g., argon, hydrogen, or helium.

In exemplary embodiments of the inventive concept, an ion doping process may be performed on the upper surfaces of the first and second preliminary mold patterns 104a and 114a, the first preliminary insulation liner 112a, and the first preliminary lower electrode 110a. The doping process may be performed at a temperature of about 100° C. to about 300° C. In the doping process, for example, silicon ions may be doped.

When the doping process is performed, the first silicon nitride 106a and 115a may be formed at the upper portion of the first and second preliminary mold patterns 104a and 114a. Thus, the first silicon nitride 106a and 115a may further include an ion used for the doping process, e.g., a silicon ion.

Figure 9:
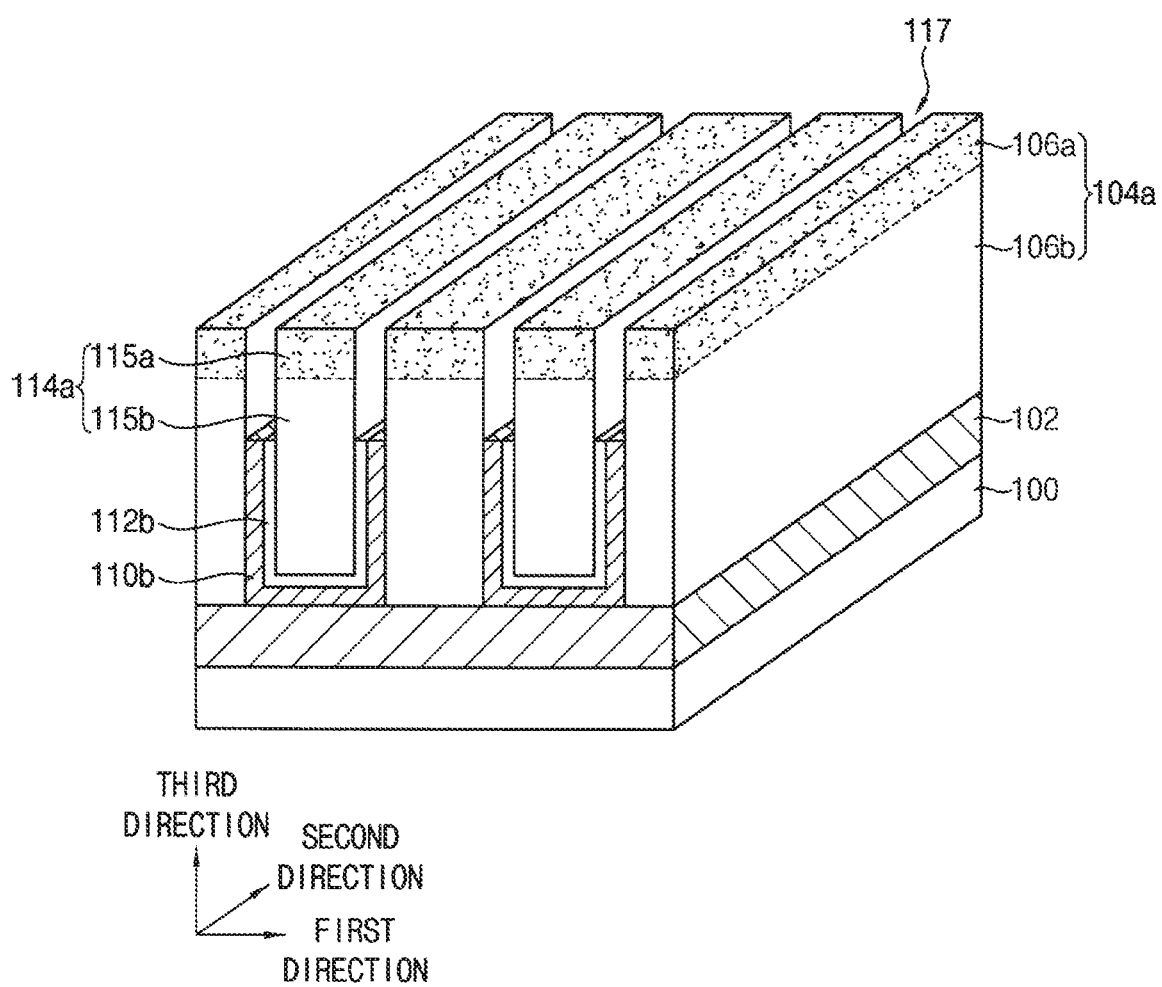

Referring to FIG. 9, the upper portions of the first preliminary lower electrode 110a and the first preliminary insulation liner 112a may be etched to form a second preliminary lower electrode 110b and the second preliminary insulation liner 112b. Thus, a recess 117 extending in the second direction may be formed at etched portions of the first preliminary lower electrode 110a and the first preliminary insulation liner 112a. The recess 117 may be defined by one sidewall of the first preliminary mold pattern 104a, one sidewall of the second preliminary mold pattern 114a, and upper surfaces of the second preliminary lower electrode 110b and the second preliminary insulation liner 112b.

As the recess 117 may be formed by partially removing of the first preliminary lower electrode 110a and the first preliminary insulation liner 112a, a width in the first direction of the recess 117 may be greater than a width in the first direction of the first preliminary lower electrode 110a. Additionally, the width in the first direction of the recess 117 may be substantially the same as a sum of the width in the first direction of the first preliminary lower electrode 110a and a width in the first direction of the first preliminary insulation liner 112a.

An etching of the upper portion of the first preliminary lower electrode 110a and an etching of the upper portion of the first preliminary insulation liner 112a may be performed by isotropic etching processes. Each of the isotropic etching processes may include, e.g., a wet etching process. The first preliminary lower electrode 110a may be etched using a first etchant, and the first preliminary insulation liner 112a may be etched using a second etchant different from the first etchant.

The upper portions of the first and second preliminary mold patterns 104a and 114a may include the first silicon nitride 106a having a high etching selectivity and a high etching tolerance. Thus, process failures, e.g. damage or removal of the upper portions of the first and second preliminary mold patterns 104a and 114a may decrease, during the etching processes.

The second preliminary lower electrode 110b and the second preliminary insulation liner 112b may have a U-shape, in a cross-sectional view taken along the first direction.

In exemplary embodiments of the inventive concept, the recess 117 may serve as a portion for forming a variable resistance pattern and a middle electrode. Thus, a bottom of the recess 117 may correspond to top surfaces of the lower electrode and the insulation liner that are subsequently formed. In exemplary embodiments of the inventive concept, the bottom of the recess 117 may be lower than a bottom of the first silicon nitride 106a.

Figure 10:
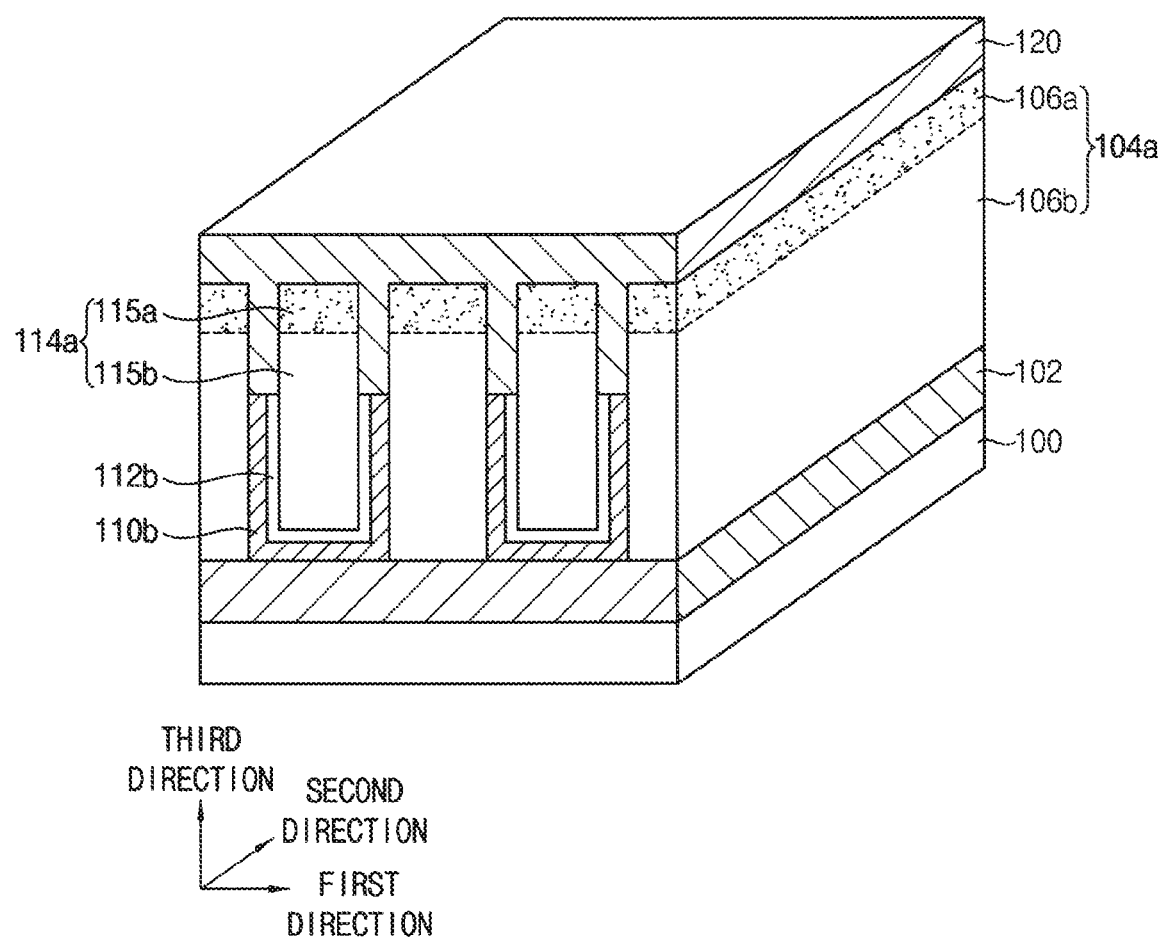

Referring to FIG. 10, a variable resistance layer 120 may be formed on the first and second preliminary mold patterns 104a and 114a to fill the recess 117. The variable resistance layer 120 may include a phase change material, e.g., a GST, an IST, or a BST material. The variable resistance layer 120 may be formed by a CVD process or an ALD process.

Figure 11:
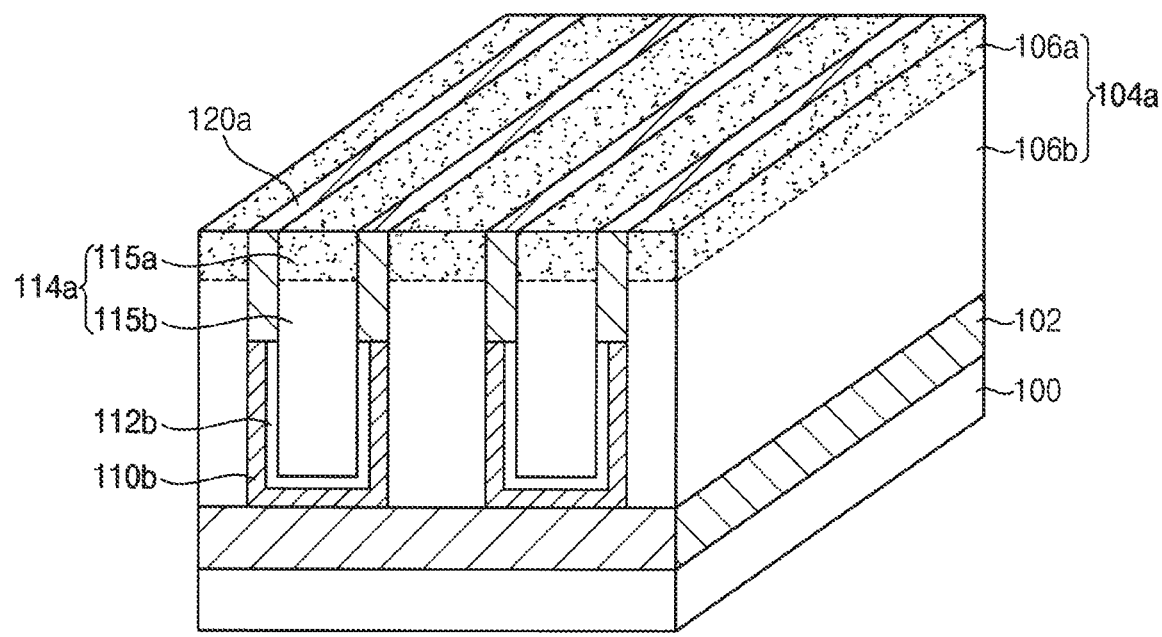

Referring to FIG. 11, the variable resistance layer 120 may be planarized until upper surfaces of the first preliminary mold patterns 104a and the second preliminary mold patterns 114a may be exposed to form the first preliminary variable resistance pattern 120a in the recess 117. The planarization process may include a CMP (chemical mechanical polishing) process.

The first preliminary variable resistance pattern 120a may protrude in the third direction from an uppermost surface of the second preliminary lower electrode 110b, and may extend in the second direction. A stacked structure including the second preliminary lower electrode 110b and the first preliminary variable resistance pattern 120a may have a U-shape.

As the upper surfaces of the first preliminary mold pattern 104a and the second preliminary mold pattern 114a may have a high polishing selectivity and a high polishing resistance, damage or consumption of the first preliminary mold pattern 104a and the second preliminary mold pattern 114a may decrease during the CMP process. Thus, the first preliminary variable resistance pattern 120a may have a desired structure.

Figure 12:
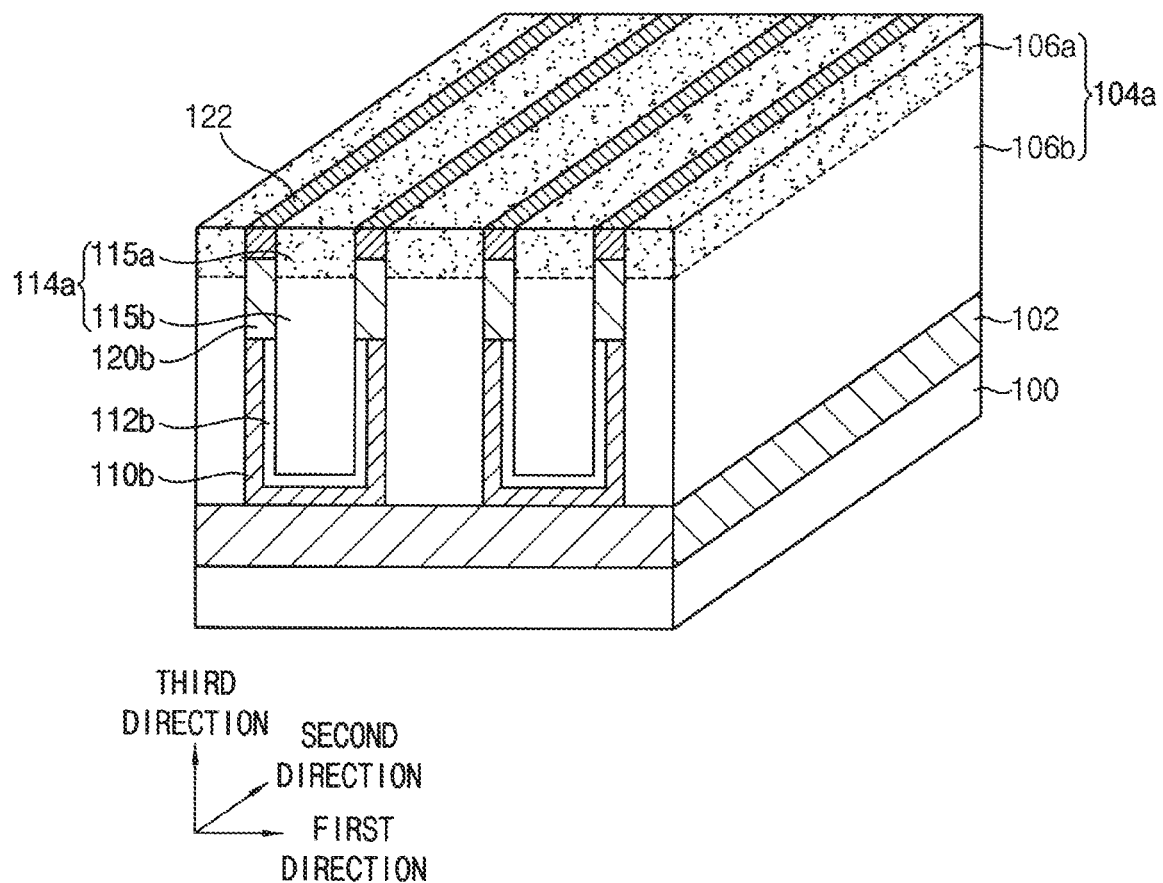

Referring to FIG. 12, an upper portion of the first preliminary variable resistance pattern 120a may be etched to form a second preliminary variable resistance pattern 120b. Thus, an upper surface of the second preliminary variable resistance pattern 120b may include a second recess. The etching process may include, e.g., an etch-back process. The second recess may extend in the second direction.

A middle electrode layer may be formed on the first preliminary mold pattern 104a and the second preliminary mold pattern 114a to fill the second recess. The middle electrode layer may be planarized until the upper surfaces of the first preliminary mold pattern 104a and the second preliminary mold pattern 114a may be exposed to form the preliminary middle electrode 122 in the second recess. The planarization process may include a CMP process.

As the upper surfaces of the first preliminary mold pattern 104a and the second preliminary mold pattern 114a may have a high polishing tolerance and a polishing selectivity, damage or consumption of the first preliminary mold pattern 104a and the second preliminary mold pattern 114a may decrease during the CMP process. Thus, the preliminary middle electrode 122 may have a desired structure.

Figure 13:
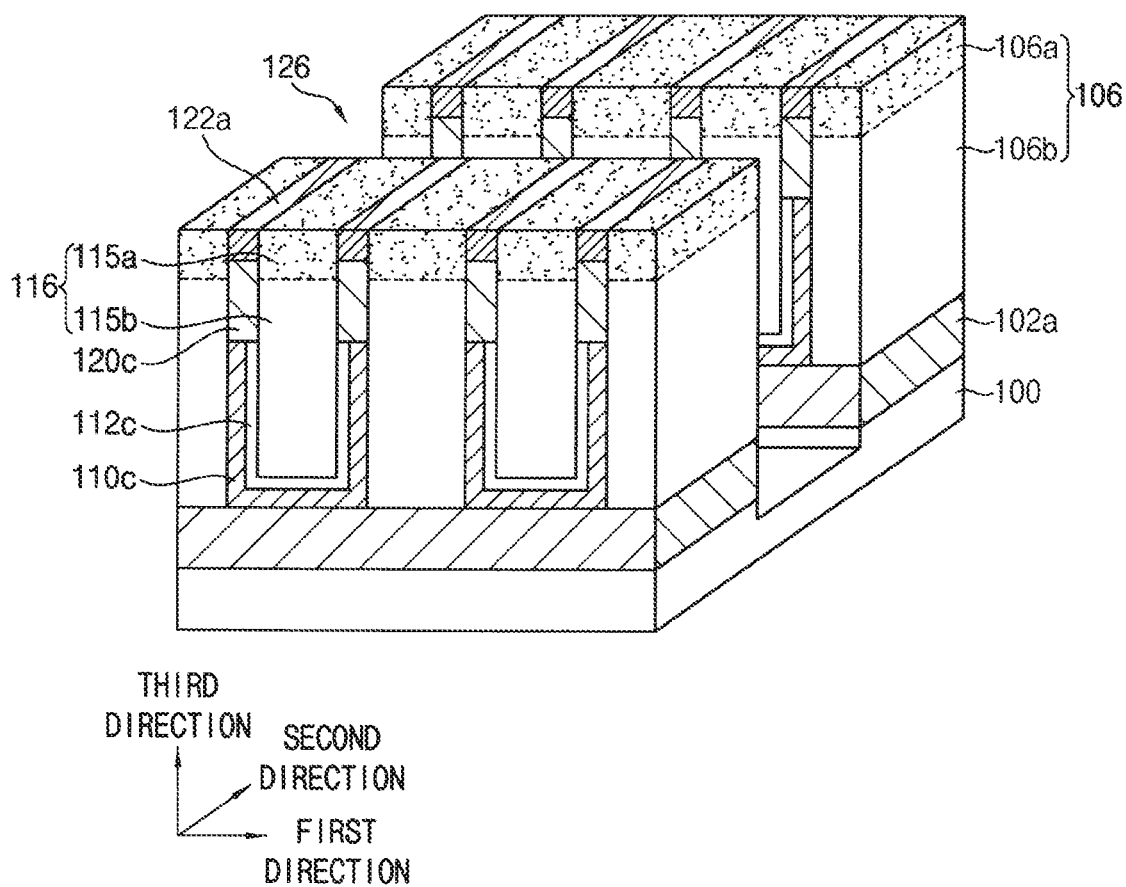

Referring to FIG. 13, the first preliminary mold pattern 104a, the second preliminary mold pattern 114a, the preliminary middle electrode 122, the second preliminary variable resistance pattern 120b, the second preliminary lower electrode 110b, the second preliminary insulation liner 112b, and the first conductive layer 102 may be partially etched to form a second trench 126 extending in the first direction. Thus, a structure including the first conductive line 102a, the lower electrode 110c, the insulation liner 112c, the variable resistance pattern 120c, the middle electrode 122a, the first mold pattern 106, and the second mold pattern 116 may be formed at sides of the second trench 126. The structure may extend in the first direction.

The first conductive line 102a may extend in the first direction.

A first stacked structure may be formed on the first conductive line 102a, and the first stacked structure may include the lower electrode 110c, the variable resistance pattern 120c, and the middle electrode 122a stacked. The insulation liner 112c may be formed on the lower electrode 110c. The second mold pattern 116 may be formed to fill an inner space of the first stacked structure. Additionally, the first mold pattern 106 may be formed on the first conductive line 102a, and the first mold pattern 106 may be formed on sidewalls in the first direction of a merged structure including the first stacked structure and the second mold pattern 116.

The lower electrode 110c may have a U-shape, in a cross-sectional view taken along the first direction. The variable resistance pattern 120c and the middle electrode 122a may be formed on an uppermost surface of the lower electrode 110c. Thus, the first stacked structure including the lower electrode 110c, the variable resistance pattern 120c, and the middle electrode 122a may have a U-shape.

Figure 14:
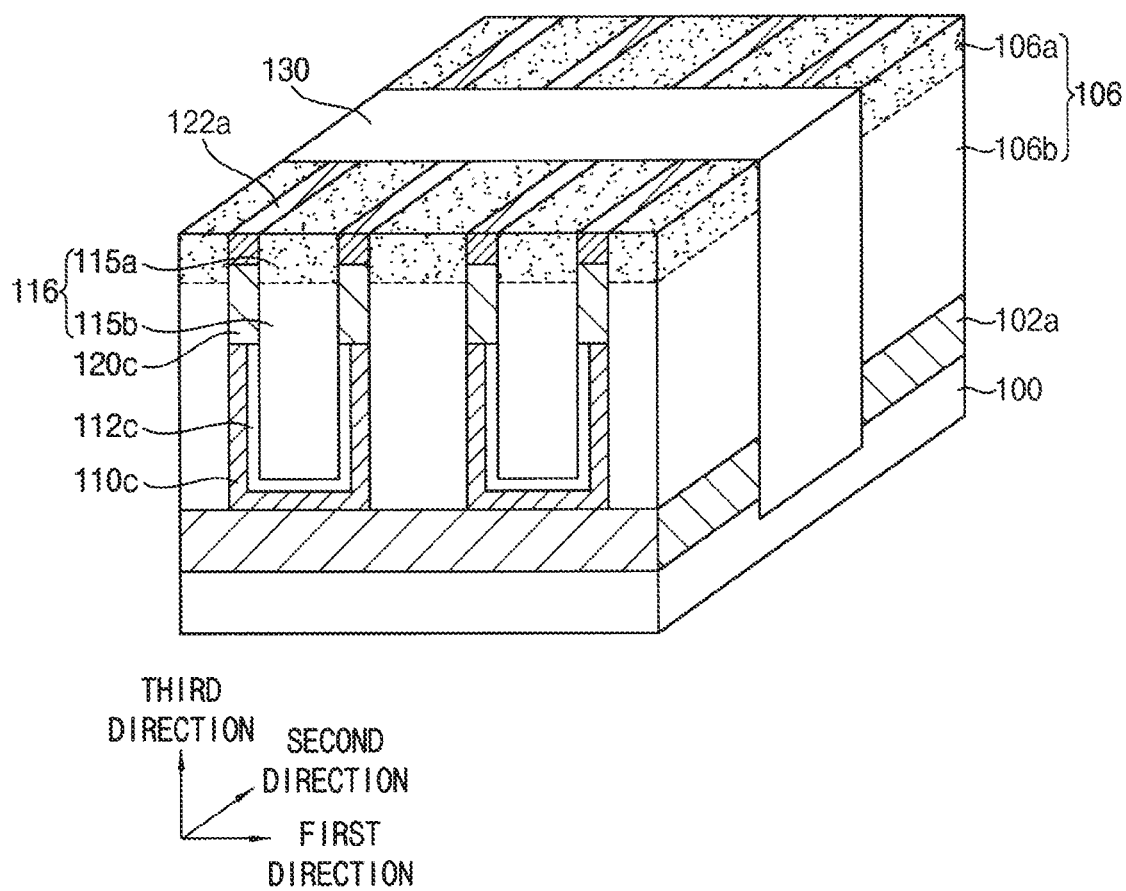

Referring to FIG. 14, an insulation layer may be formed on the first and second mold patterns 106 and 116 and the middle electrode 122a to fill the second trench 126. The insulation layer may be planarized until the upper surfaces of the first and second mold patterns 106 and 116 may be exposed to form the filling insulation layer 130 in the second trench 126.

The filling insulation layer 130 may be formed on the substrate 100, and may extend in the first direction. The filling insulation layer 130 may include silicon nitride or silicon oxide. A surface treatment process, e.g., a low-temperature plasma treatment process, a doping process of ions, etc. may not be performed at the filling insulation layer 130.

Figure 15:
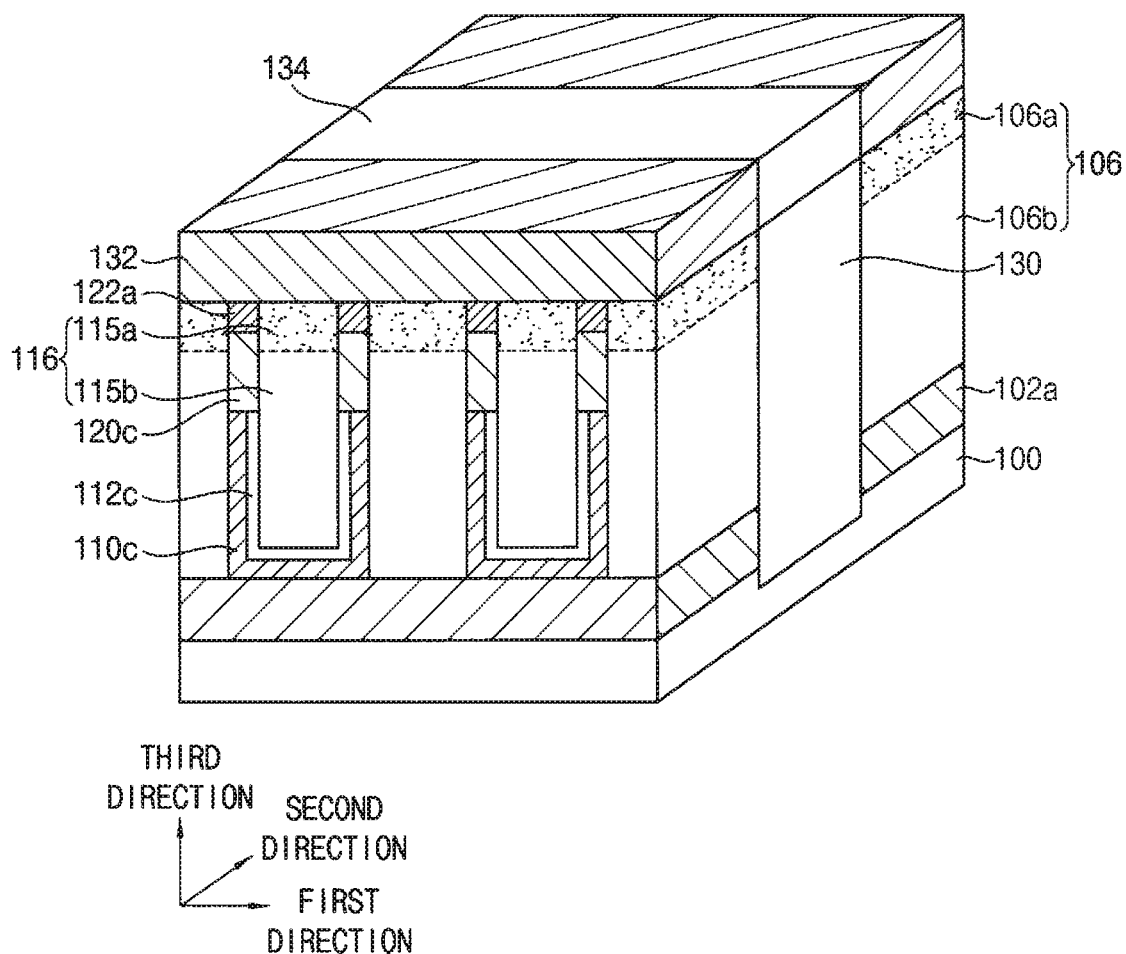

Referring to FIG. 15, a selective material layer may be formed on the first and second mold patterns 106 and 116, the filling insulation layer 130, and the middle electrode 122a. The selective material layer may be patterned to form preliminary selection patterns 132 extending in the first direction. Each of the preliminary selection patterns 132 may contact an upper surface of the middle electrode 122a.

A third trench extending in the first direction may be formed between the preliminary selection patterns 132.

A first insulation layer may be formed to fill the third trench. The first insulation layer may be planarized until an upper surface of the preliminary selection patterns 132 may be exposed to form a first preliminary insulation pattern 134. The first preliminary insulation pattern 134 may include silicon nitride or silicon oxide.

In exemplary embodiments of the inventive concept, an upper electrode layer may be further formed on the selective material layer. For example, the upper electrode layer may include a conductive material containing carbon such as C, CN, TiCN, TaCN, or the like. In this case, a variable resistance memory device subsequently formed may further include an upper electrode between a selection pattern and a second conductive line.

Figure 16:
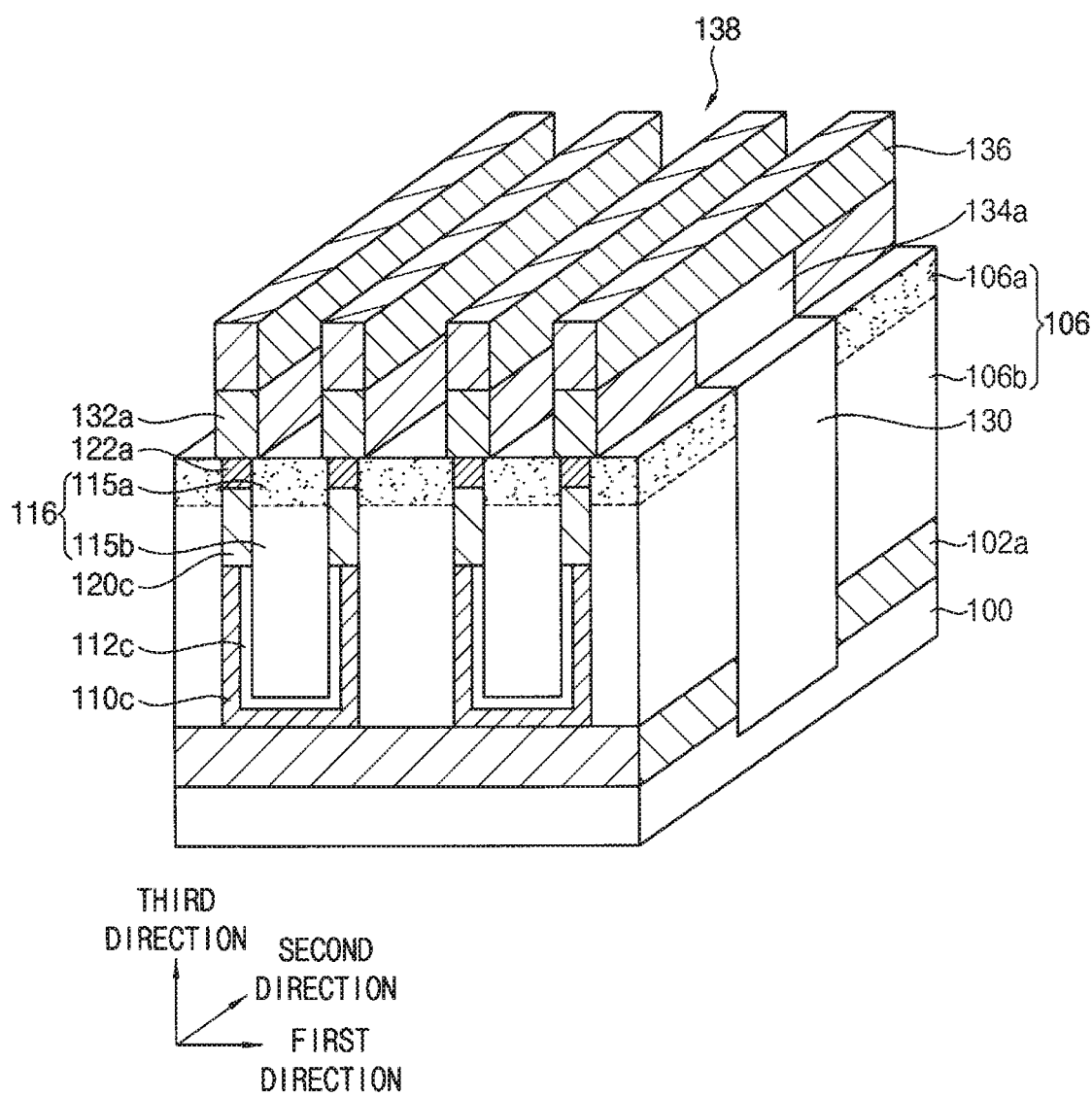

Referring to FIG. 16, a second conductive layer may be formed on the preliminary selection patterns 132 and the first preliminary insulation pattern 134. Etching masks extending in the second direction may be formed on the second conductive layer, and the second conductive layer may be etched using the etching mask to form the second conductive line 136 extending in the second direction.

Subsequently, the preliminary selection patterns 132 and the first preliminary insulation pattern 134 may be etched using the etching masks to form the selection pattern 132a and a first insulation pattern 134a. The selection pattern 132a may have a pillar shape, and may contact the middle electrode 122a.

When the etching process is performed, a fourth trench 138 may be formed between the second conductive lines 136. The fourth trench 138 may extend in the second direction.

Figure 17:
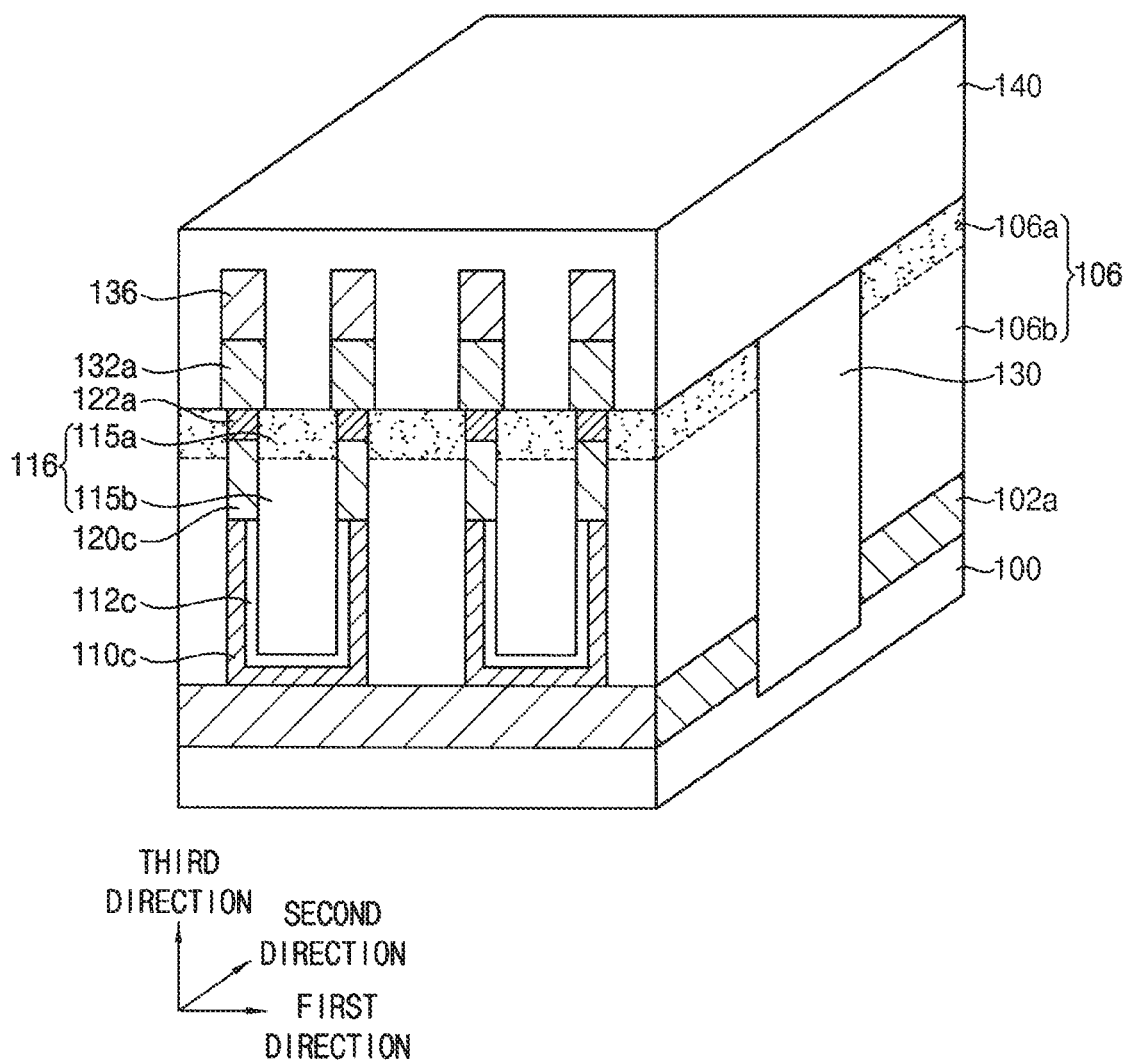

Referring to FIG. 17, the second insulation layer 140 is formed on the second conductive line 136 to fill the fourth trench 138. The second insulation layer 140 may include silicon nitride or silicon oxide.

By the above processes, the variable resistance memory device may be manufactured to include variable resistance memory cells at the cross point of the first conductive line 102a and the second conductive line 136. The variable resistance memory cell may include the lower electrode 110c, the variable resistance pattern 120c, the middle electrode 122a, and the selection pattern 132a. The lower electrode 110c may have a U-shape, in a cross-sectional view taken along the first direction. The variable resistance pattern 120c, the middle electrode 122a, and the selection pattern 132a may be formed on each of two uppermost surfaces of the lower electrode 110c facing each other. Thus, two variable resistance memory cells may be formed on the lower electrode 110c.

Figure 18:
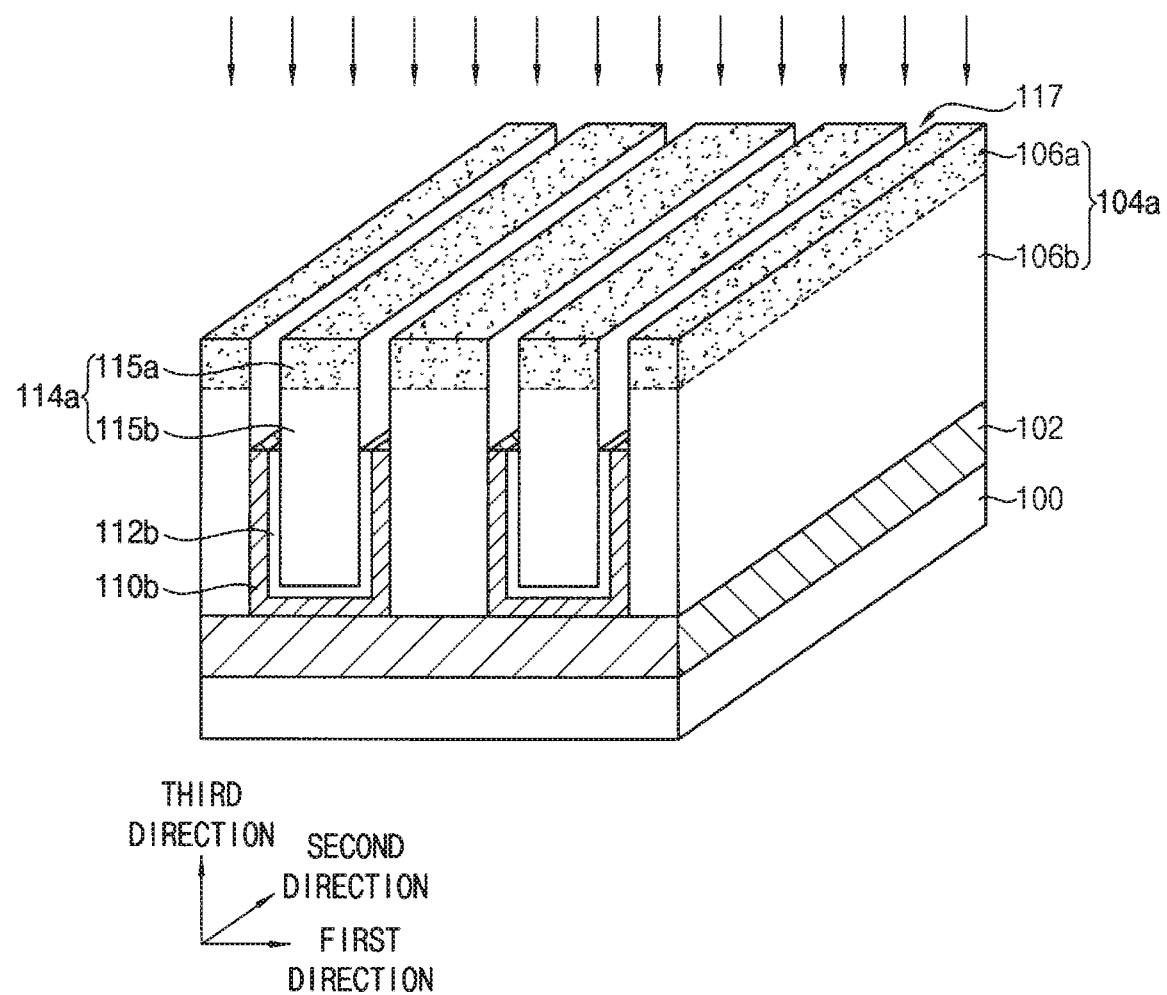
FIG. 18 is a perspective view illustrating stages of a method of manufacturing a variable resistance memory device according to an exemplary embodiment of the inventive concept.

FIG. 18 is a perspective view illustrating stages of a method of manufacturing a variable resistance memory device according to an exemplary embodiment of the inventive concept.

Processes described below may be substantially the same as that described with reference to FIG. 4 to 17, except for orders of a surface treatment process for hardening of upper portions of the first and second preliminary mold patterns.

First, processes substantially the same as or similar to those illustrated with reference to FIGS. 4 to 7 may be performed. Thus, as shown in FIG. 7, the first and second preliminary mold patterns 104a and 114a, the first preliminary insulation liner 112a, and the first preliminary lower electrode 110a may be formed. Then, as illustrated with reference to FIG. 9, upper portions of the first preliminary lower electrode 110a and the first preliminary insulation liner 112a may be etched to form the second preliminary lower electrode 110b and the second preliminary insulation liner 112b. Thus, referring to FIG. 18, a recess 117 extending in the second direction may be formed at etched portions of the first preliminary lower electrode 110a and the first preliminary insulation liner 112a.

Thereafter, as illustrated with reference to FIG. 8, a surface treatment process may be performed to harden upper portions of the first and second preliminary mold patterns 104a and 114a. In other words, the surface treatment process may be performed after forming the recess 117.

Subsequently, processes substantially the same as or similar to those illustrated with reference to FIGS. 10 to 17 may be performed to form the variable resistance memory device as shown in FIG. 17.

Figure 19:
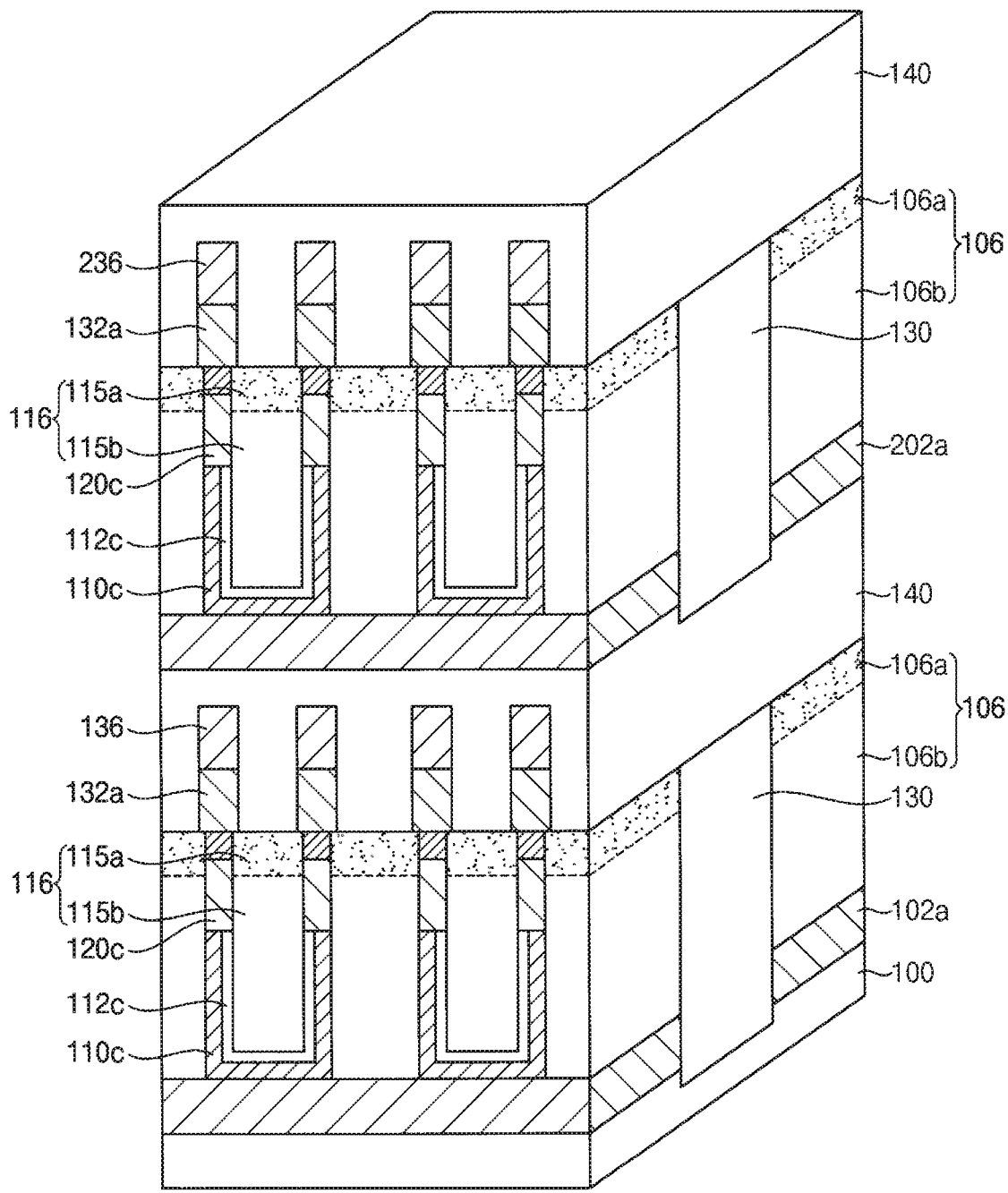
FIG. 19 is a perspective view illustrating a variable resistance memory device according to an exemplary embodiment of the inventive concept.

FIG. 19 is a perspective view illustrating a variable resistance memory device according to an exemplary embodiment of the inventive concept.

In FIG. 19, the variable resistance memory device may include a cross-point cell array of a second-level memory cell structure according to an exemplary embodiment of the inventive concept. However, in exemplary embodiments of the inventive concept, the variable resistor memory device may include a cross-point cell array of a third-level memory cell structure or a memory cell structure having more than three levels.

Referring to FIG. 19, the variable resistance memory device may be formed on the substrate 100. The variable resistance memory device may include the first conductive line 102a, the second conductive line 136, a third conductive line 202a, and a fourth conductive line 236, which may be spaced apart from one another in the third direction.

The first conductive line 102a and the second conductive line 136 may intersect with each other. The third conductive line 202a and the fourth conductive line 236 may intersect with each other. A first memory cell may be disposed at a cross point of the first and second conductive lines 102a and 136, and a second memory cell may be disposed at a cross point of the third conductive line 202a and the fourth conductive line 236.

A first level memory cell array including the first and second conductive lines 102a and 136 and the first memory cells may be substantially the same as those illustrated with reference to FIGS. 1 to 3.

Additionally, a second-level memory cell array including the third and fourth conductive lines 202a and 236 and the second memory cells may be substantially the same as those illustrated with reference to FIGS. 1 to 3.

In other words, the variable resistance memory device may include memory cell arrays having substantially the same structure repeatedly stacked in the third direction.

A method for manufacturing the variable resistance memory device shown in FIG. 19 will be briefly described below.

First, processes substantially the same as or similar to that illustrated with reference to FIGS. 4 to 17 may be performed to form a first-level memory cell array on a substrate.

Then, processes substantially the same as or similar to that illustrated with reference to FIGS. 4 to 17 may be performed once again on the first-level memory cell array to form a second-level memory cell array on the second insulation layer.

When the second-level memory cell array is formed, the first memory cells included in the first-level memory cell should not be damaged or change in characteristics. For example, when the surface treatment process is performed at the first and second mold patterns included in the second-level memory cell array, the first memory cells underlying should not be damaged.

In exemplary embodiments of the inventive concept, the surface treatment process may include a low-temperature plasma process or an ion doping process carried out at a temperature of about 100° C. to about 300° C. In the surface treatment process, thermal damages may be hardly generated in the underlying first memory cells. Thus, the surface treatment process may be used in a process for manufacturing a resistance memory device having the second-level or multi-level memory cell arrays stacked on one another.

Figure 20:
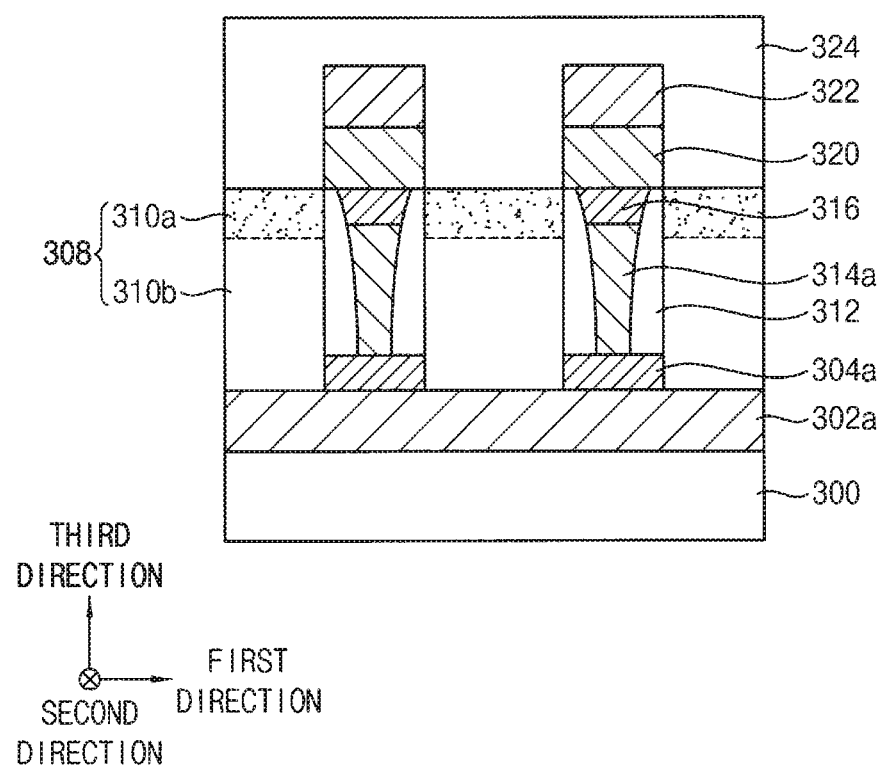
FIG. 20 is a cross-sectional view illustrating a variable resistance memory cell according to an exemplary embodiment of the inventive concept.

FIG. 20 is a cross-sectional view illustrating a variable resistance memory cell according to an exemplary embodiment of the inventive concept.

Referring to FIG. 20, the variable resistance memory device may include a first conductive line 302a, a variable resistance memory cell, and a second conductive line 322. The variable resistance memory device may be formed on the substrate 300.

The first conductive line 302a and the second conductive line 322 may be spaced apart from each other in the third direction, and may be vertically intersect with each other. The variable resistance memory cell may be formed at a cross point of the first and second conductive lines 302a and 322. The variable resistance memory cell may contact an upper surface of the first conductive line 302a and a lower surface of the second conductive line 322. The first conductive line 302 may extend in the first direction, and the second conductive line 322 may extend in the second direction.

In exemplary embodiments of the inventive concept, the variable resistance memory cell may include a lower electrode 304a, a variable resistance pattern 314a, a middle electrode 316, and a selection pattern 320 sequentially stacked. In exemplary embodiments of the inventive concept, an upper electrode may be further formed on the selection pattern 320. The variable resistance memory cell may have a pillar shape.

A mold pattern 308 may be formed between the first conductive line 302, the variable resistance pattern 314a, and the middle electrode 316.

A spacer 312 may surround a stacked structure including the variable resistance pattern 314a and the middle electrode 316. The spacer 312 may be disposed between the stacked structure, including the variable resistance pattern 314a and the middle electrode 316, and the mold pattern 308. The spacer 312 may include an insulating material, e.g., silicon nitride, silicon oxynitride, silicon oxide, etc.

A width of the variable resistance pattern 314a may be reduced by the spacer 312. A lower width of the variable resistance pattern 314a may be less than a width of the lower electrode 304a below the variable resistance pattern 314a. Thus, a contact area between the variable resistance pattern 314a and the lower electrode 304a may decrease, and the heat transfer efficiency from the lower electrode 304a to the variable resistance pattern 314a may be increased.

An upper surface of the mold pattern 308 and an upper surface of the middle electrode 316 may be coplanar with each other.

An upper portion of the mold pattern 308 may include a surface treated layer by performing a surface treatment, and a lower portion of the mold pattern 308 may include a layer without performing a surface treatment. Thus, the upper portion of the mold pattern 308 may have a hardness different from a hardness of the lower portion of the mold pattern 308. In other words, the upper portion of the mold pattern 308 may have a hardness greater than a hardness of the lower portion of the mold pattern 308.

In exemplary embodiments of the inventive concept, the upper portion of the mold pattern 308 may include a first silicon nitride 310a modified by the surface treatment, and the lower portion of the mold pattern 308 may include a second silicon nitride 310b without performing a surface treatment.

In exemplary embodiments of the inventive concept, the surface treatment may include a low-temperature plasma treatment process or an ion doping process. The first silicon nitride 310a may have a hardness greater than a hardness of the second silicon nitride 310b.

For example, the first silicon nitride 310a may further include gases used for the plasma treatment. Thus, when components of the first silicon nitride 310a are analyzed, a peak value of the components of the gases used for the plasma treatment in the first silicon nitride 310a may be detected. The gases used for the plasma treatment may include argon, hydrogen, helium, etc.

In exemplary embodiments of the inventive concept, the first silicon nitride 310a may further include an ion used in the doping process. Accordingly, when components of the first silicon nitride 310a are analyzed, a peak value of the components of the gases used in the doping process in the second silicon nitride 310b may be detected. The ion used in the plasma treatment may include silicon ion.

In exemplary embodiments of the inventive concept, the first silicon nitride 310a may be opposite to at least portions of a sidewall of the middle electrode 316. In exemplary embodiments of the inventive concept, the first silicon nitride 310a may be opposite to a sidewall of the middle electrode 316 and at least portions of a sidewall of the variable resistance pattern 314a.

The selection pattern 320 may be formed on the middle electrode 316. A first insulation pattern may be formed between the selection pattern 320 in the second direction. The first insulation pattern may include silicon oxide or silicon nitride. Additionally, the second conductive line 322 may be formed on the selection pattern 320 and the first insulation pattern.

A second insulation layer 324 may be formed on the mold pattern 308 to fill a space between the second conductive lines 322. The second insulation layer 324 may include silicon oxide or silicon nitride. In exemplary embodiments of the inventive concept, the second insulation layer 324 may include a material substantially the same as a material of the first insulation pattern.

In exemplary embodiments of the inventive concept, the cross point cell array structure may be a multi-level structure.

For example, a third conductive line may be further formed over the second conductive line, and extends in the first direction. The second and third conductive lines may be spaced apart from each other in the third direction. A variable resistance memory cell may be formed at a cross point of the second conductive line and the third conductive line. Additionally, a mold pattern may be formed between the second conductive line 302, a variable resistance pattern 314a, and a middle electrode in substantially the same manner as a mold pattern underlying. The second conductive line may be commonly used for the lower cell array structure and the upper cell array structure.

FIGS. 21 to 27 are cross-sectional views illustrating stages of a method of manufacturing a variable resistance memory device according to an exemplary embodiment of the inventive concept.

Figure 21:
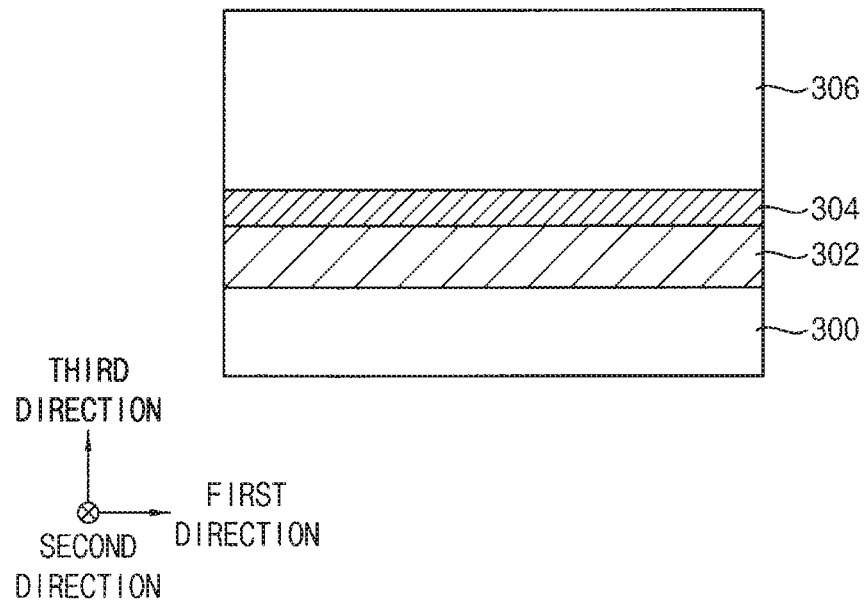
FIGS. 21 to 27 are cross-sectional views illustrating stages of a method of manufacturing a variable resistance memory device according to an exemplary embodiment of the inventive concept.

Referring to FIG. 21, a first conductive layer 302, a lower electrode layer 304, and a sacrificial layer 306 may be sequentially formed on the substrate 300.

The sacrificial layer 306 may serve as portions for forming the variable resistance pattern and the middle electrode. Thus, the sacrificial layer 306 may have a height equal to or higher than a height of a stacked structure including the variable resistance pattern and the middle electrode.

The sacrificial layer 306 may be formed by an ALD process or a CVD process. The sacrificial layer 306 may include an oxide, e.g., silicon oxide.

Figure 22:
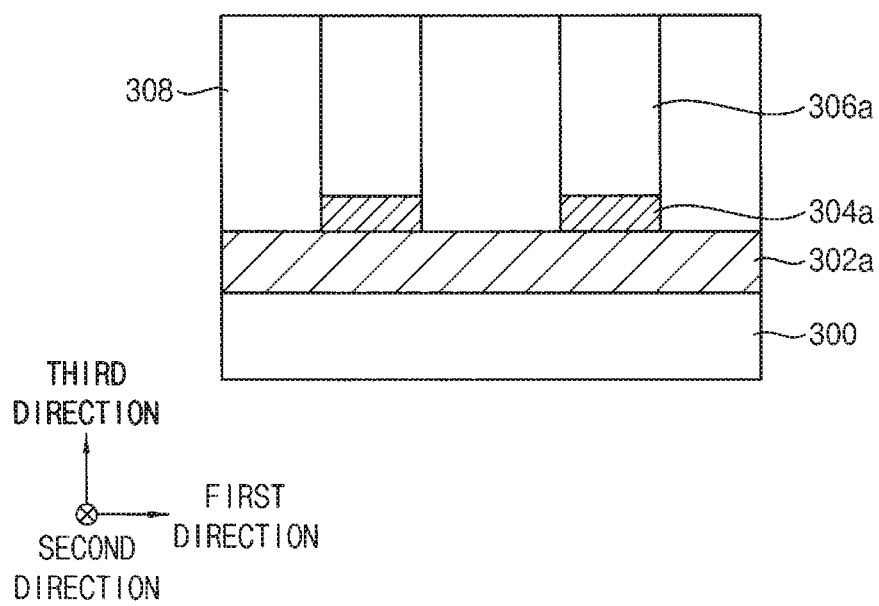

Referring to FIG. 22, the sacrificial layer 306, the lower electrode layer 304, and the first conductive layer 302 may be partially etched to form the first conductive line 302a, the lower electrode 304a, and a sacrificial pattern 306a sequentially stacked on the substrate 300. Additionally, the mold pattern 308 may be formed between the first conductive line 302a, the lower electrode 304a, and the sacrificial pattern 306a.

Particularly, an etch mask having a line shape extending in the first direction may be formed on the sacrificial layer 306. The sacrificial layer 306, the lower electrode layer 304, and the first conductive layer 302 may be etched using the etch mask to form a preliminary structure extending in the first direction. The first conductive line 302a extending in the first direction may be formed by the etching process. Additionally, a first trench extending in the first direction may be formed between the preliminary structures.

A mold layer may be formed to fill the first trench. The mold layer may include silicon nitride. The mold layer may be planarized until an upper surface of the sacrificial layer may be exposed to form a first preliminary mold pattern in the first trench.

Subsequently, the sacrificial layer 306, the lower electrode layer 304, and the first preliminary mold pattern may be etched to form a second trench extending in the second direction. Thus, a stacked structure including the lower electrode 304a and the sacrificial pattern 306a sequentially stacked may be formed on the first conductive line 302a. The stacked structure may have a pillar shape.

A mold layer may be formed to fill the second trench. The mold layer may include silicon nitride. The mold layer may be planarized until an upper surface of the sacrificial layer may be exposed to form a second preliminary mold pattern in the second trench. The first and second preliminary mold patterns may be merged into the mold pattern 308. The mold pattern 308 may fill a gap between the stacked structures.

Figure 23:
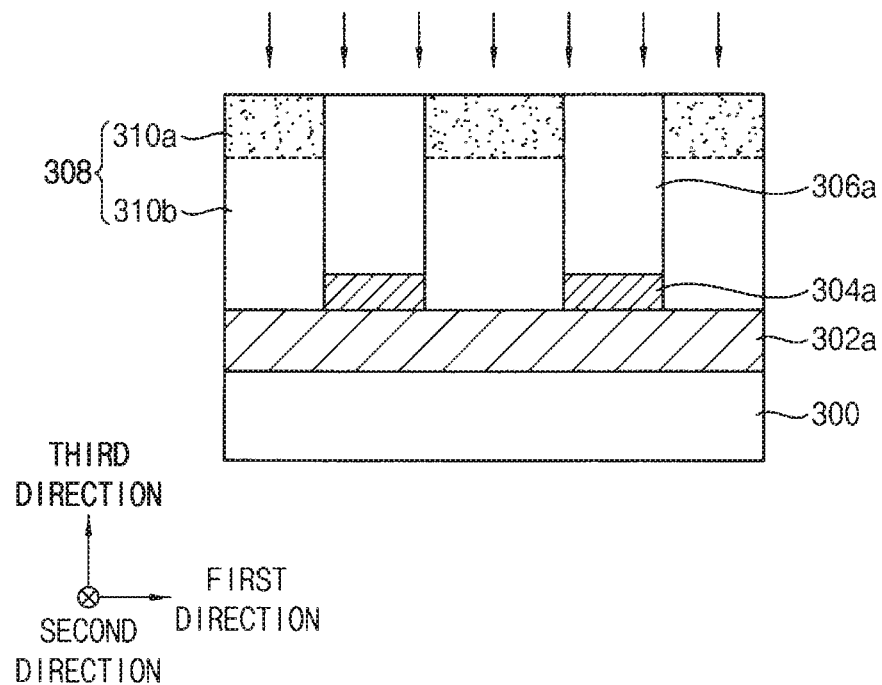

Referring to FIG. 23, a surface treatment process may be performed to harden upper portions of the mold pattern 308

For example, the upper portion of the mold pattern 308 include the first silicon nitride 310a modified by the surface treatment process. Lower portion of the mold pattern 308 may include the second silicon nitride 310b without performing the surface treatment process.

The upper portion of the mold pattern 308 may have a hardness greater than a hardness of the lower portion of the mold pattern 308. Additionally, the upper portion of the mold pattern 308 may have a polishing selectivity and an etching selectivity higher than those of the lower portion of the mold pattern 308. When a subsequent cleaning, etching, or polishing process is performed, a surface damage of the mold pattern may decrease.

In exemplary embodiments of the inventive concept, the surface treatment process may include a low-temperature plasma process or an ion doping process. The surface treatment process may be substantially the same as that illustrated with reference to FIG. 8.

Figure 24:
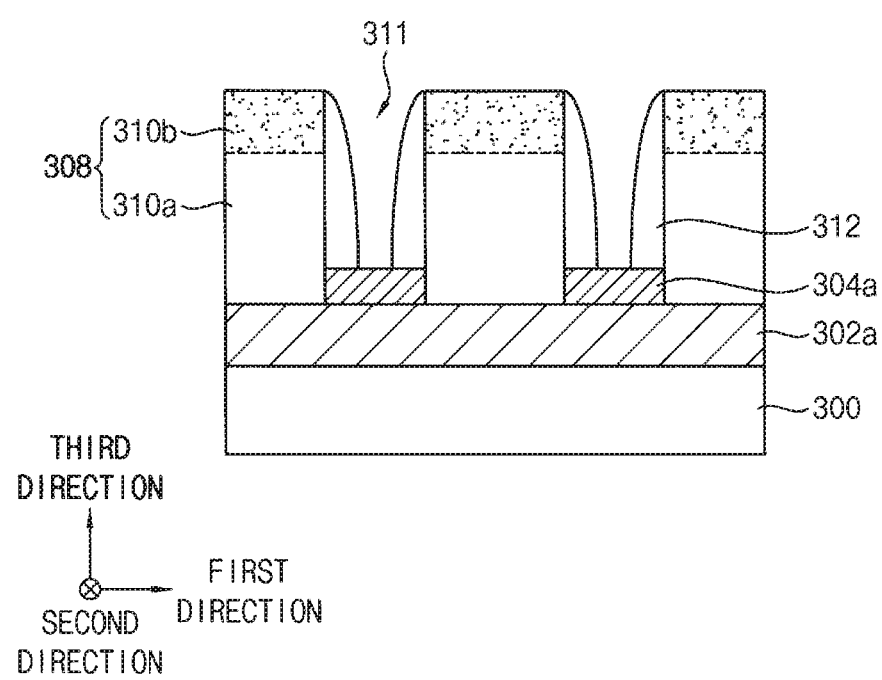

Referring to FIG. 24, the upper portion of the sacrificial pattern 306a may be removed to form a first hole 311 exposing the lower electrode 304a through the mold pattern 308. The removing process may include an isotropic etching process. The mold pattern 308 may be exposed by a sidewall of the first hole 311.

A spacer layer may be conformally formed on the sidewall and a bottom of the first hole 311 and the mold pattern 308. The spacer layer may include silicon nitride, silicon oxynitride, or silicon oxide. The spacers 312 may be anisotropically etched to form a spacer on the sidewall of the first holes 311.

Figure 25:
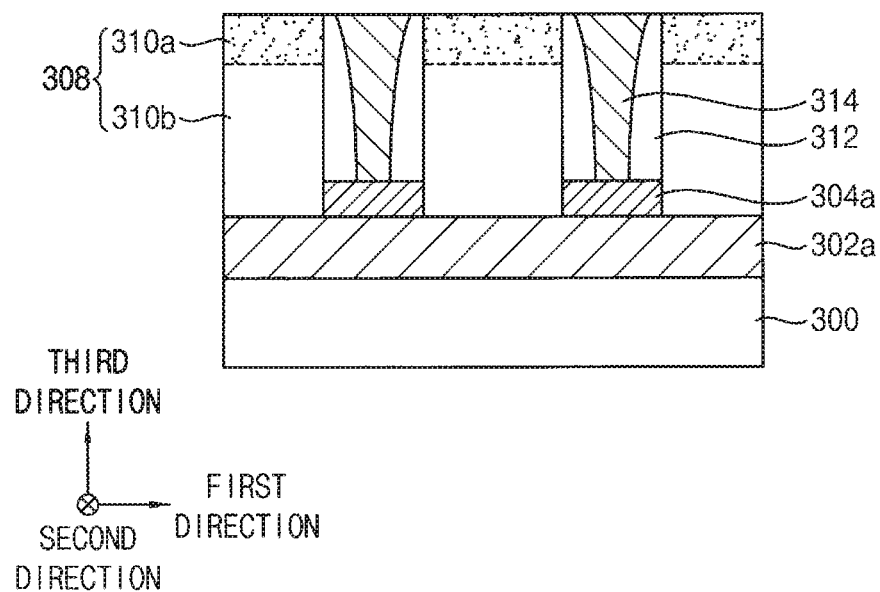

Referring to FIG. 25, a variable resistance layer may be formed on the mold pattern 308 to fill the first hole 311. The variable resistance layer is planarized until an upper surface of the mold pattern 308 may be exposed to form a preliminary variable resistance pattern 314 in the first hole 311.

As the upper surface of the mold pattern 308 may have a high polishing selectivity and a high polishing tolerance, damage and consumption of the mold pattern 308 may decrease during the CMP process.

Figure 26:
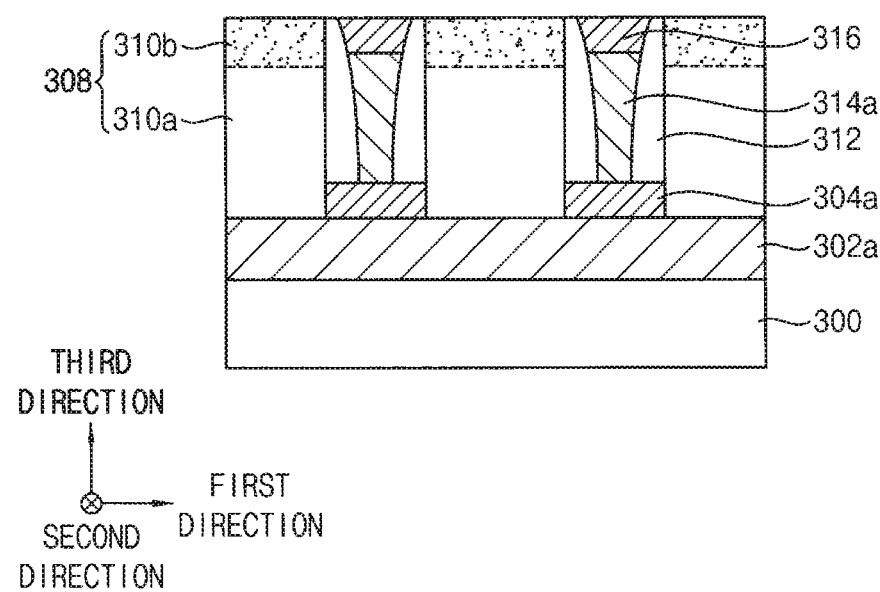

Referring to FIG. 26, an upper portion of the preliminary variable resistance pattern 314 may be partially etched to form the variable resistance pattern 314a. Thus, an upper surface of the variable resistance pattern 314a may have a recess. The etching process may include an etch-back process.

A middle electrode layer may be formed on the mold pattern 308 to fill the recess. The middle electrode layer may be planarized until the upper surface of the mold pattern 308 may be exposed to form the middle electrode 316 in the recess.

As the upper surface of the mold pattern 308 may have high polishing tolerance, the damage and consumption of the mold pattern 308 may decrease during the CMP process. Thus, the desired middle electrode 316 and variable resistance pattern 314a may be formed.

Figure 27:
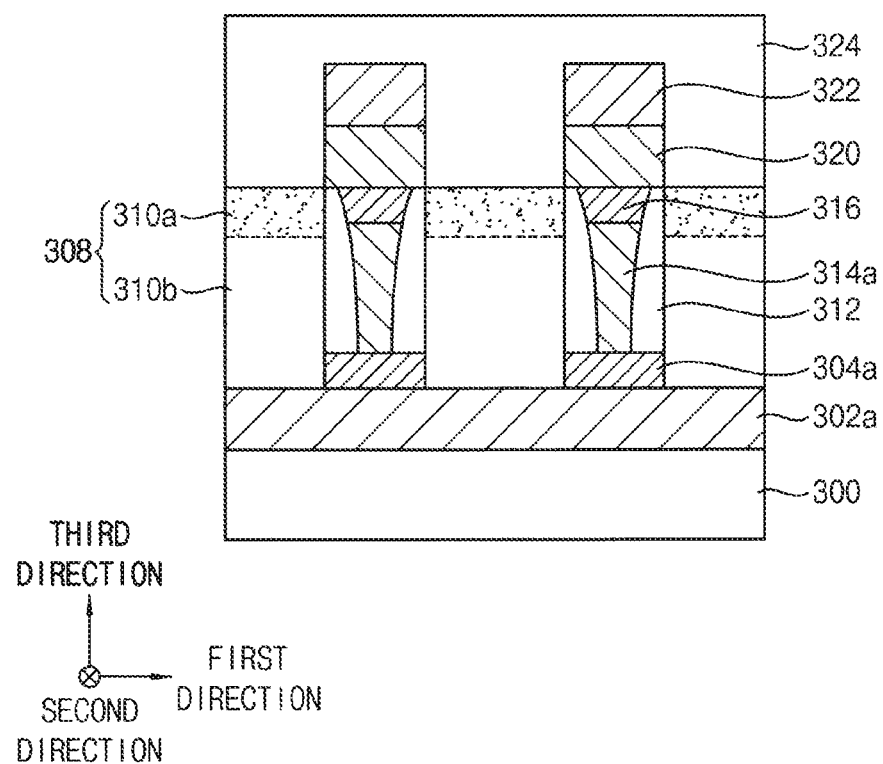

Referring to FIG. 27, a selective material layer may be formed on the variable resistance pattern 314a and the mold pattern 308. The selective material layer may be patterned to form preliminary selection patterns extending in the first direction. A first preliminary insulation pattern may be formed to fill a space between the preliminary selection patterns. The first preliminary insulation pattern may include silicon nitride or silicon oxide. In exemplary embodiments of the inventive concept, an upper electrode layer may be further formed on the selective material layer.

A second conductive layer may be formed on the preliminary selection patterns and the first preliminary insulation pattern. An etching mask extending in the second direction may be formed on the second conductive layer. The second conductive layer may be etched using an etching mask to form the second conductive line 322 extending in the second direction.

Subsequently, the preliminary selection patterns and the first preliminary insulation pattern may be etched using the etching masks to form the selection pattern 320 and a first insulation pattern. The selection pattern 320 may contact the middle electrode 316, and may have a pillar shape.

Then, the second insulation layer 324 may be formed between the second conductive lines 322. The second insulation layer 324 may include silicon nitride or silicon oxide.

Accordingly, by the above processes, a variable resistance memory device including a variable resistance memory cell at a cross point of the first conductive line and the second conductive line may be manufactured.

Figure 28:
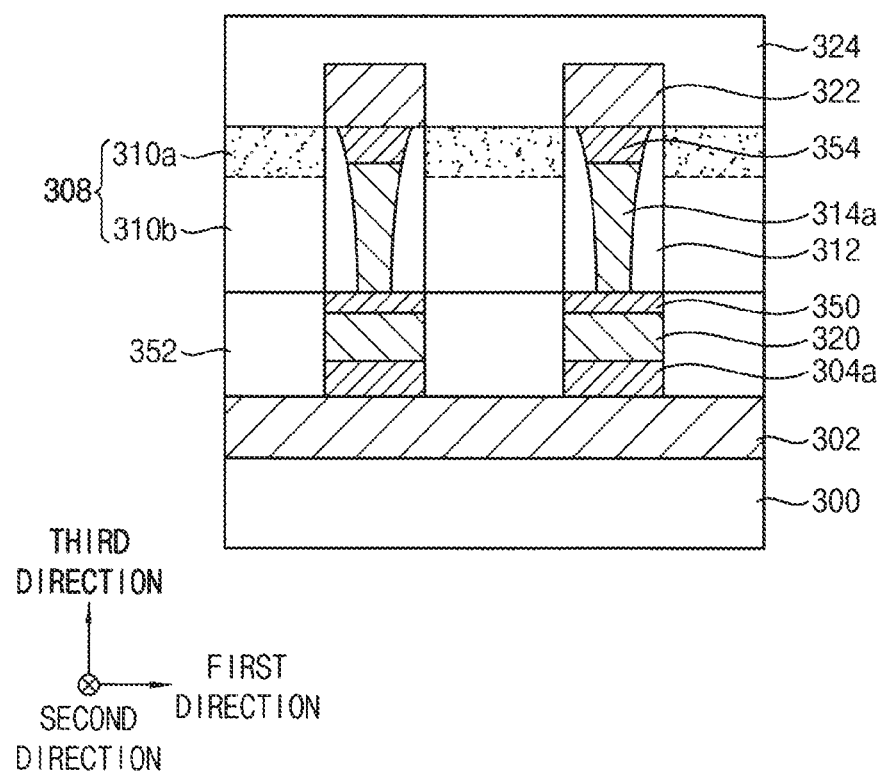
FIG. 28 is a cross-sectional view illustrating a variable resistance memory device according to an exemplary embodiment of the inventive concept.

FIG. 28 is a cross-sectional view illustrating a variable resistance memory device according to an exemplary embodiment of the inventive concept.

In the variable resistance memory device, a stacking order of variable resistance memory cells may be different from a stacking order of the memory cells shown in FIG. 20.

Referring to FIG. 28, the variable resistance memory device may include a first conductive line 302, a variable resistance memory cell, and the second conductive line 322.

The variable resistance memory cell may include the lower electrode 304a, the selection pattern 320, a middle electrode 350, the variable resistance pattern 314a, and an upper electrode 354 sequentially stacked. Spacers 312 may be formed on a sidewall of a stacked structure including the variable resistance pattern 314a and the upper electrode 354.

A lower insulation pattern 352 may be formed between stacked structures including the lower electrode 304a, the selection pattern 320, and the middle electrode 350. The mold pattern 308 may be formed on the lower insulation pattern 352 to fill a space between the stacked structures in which the spacer may be formed.

The upper portion of the mold pattern 308 includes a surface treated layer by performing a surface treatment, and the lower portion of the mold pattern 308 may include a non-surface treated layer without performing a surface treatment. Thus, the upper portion of the mold pattern 308 may have a hardness different from a hardness of the lower portion of the mold pattern 308. In other words, the upper portion of the mold pattern 308 may have a hardness greater than a hardness of the lower portion of the mold pattern 308.

For example, the upper portion of the mold pattern 308 may include the first silicon nitride 310a modified by performing the surface treatment. The lower portions of the mold pattern 308 may include the second silicon nitride 310b without performing the surface treatment.

In exemplary embodiments of the inventive concept, the first silicon nitride 310a may be opposite to at least portions of a sidewall of the upper electrode 354 on the variable resistance pattern 314a. In exemplary embodiments of the inventive concept, the first silicon nitride 310a may be opposite to a sidewall of the upper electrode 354 and at least portions of a sidewall of the variable resistance pattern 314a.

For manufacturing a semiconductor device, the first conductive line 302, the lower electrode 304a, the selection pattern 320, and the middle electrode 350 may be formed by a patterning process, and the lower insulation pattern 352 may be formed to fill a space between the first conductive line 302, the lower electrode 304a, the selection pattern 320, and the middle electrode 350. Thereafter, the variable resistance pattern 314a and the upper electrode 354 may be formed by a damascene process. In this case, processes for forming the mold pattern 308, the spacer 312, the variable resistance pattern 314a, and the upper electrode 354 may be substantially the same as those illustrated with reference to FIGS. 22 to 26. Then, the second conductive line 322 and the second insulation layer 324 may be formed on the upper electrode 354.

As described above, the semiconductor device may be applied to a high integrated variable resistance memory device.

According to exemplary embodiments of the inventive concept, in the variable resistance memory device, the upper surfaces of the mold patterns may be hardened, so that the variable resistance pattern between the mold patterns may have a desired structure. Thus, the variable resistance memory device may have a stable structure and high reliability.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A variable resistance memory device, comprising:
a first conductive line on a substrate;
a plurality of stacked structures on the first conductive line, wherein each of the plurality of stacked structures includes a lower electrode, a variable resistance pattern, and a middle electrode stacked on one another; and
a mold pattern on the first conductive line to fill a space between the plurality of stacked structures,
wherein an upper portion of the mold pattern includes a surface treated layer and a lower portion of the mold pattern includes a non-surface treated layer.

2. The variable resistance memory device of claim 1, wherein the lower electrode has a U-shape, and the variable resistance pattern and the middle electrode are sequentially formed on each of uppermost surfaces of the lower electrode facing each other.

3. The variable resistance memory device of claim 1, wherein the variable resistance pattern and the middle electrode are formed in a recess defined by a top surface of the lower electrode and a sidewall of the mold pattern.

4. The variable resistance memory device of claim 1, wherein the upper portion of the mold pattern has a hardness different from a hardness of the lower portion of the mold pattern.

5. The variable resistance memory device of claim 4, wherein the upper portion of the mold pattern includes a first silicon nitride, and the lower portion of the mold pattern includes a second silicon nitride, and wherein the first silicon nitride has a hardness greater than a hardness of the second silicon nitride.

6. The variable resistance memory device of claim 1, wherein the upper portion of the mold pattern is higher than a lower surface of the variable resistance pattern with respect to the substrate.

7. The variable resistance memory device of claim 1, wherein the upper portion of the mold pattern is opposite to at least portions of a sidewall of the middle electrode.

8. The variable resistance memory device of claim 1, wherein the upper portion of the mold pattern further includes argon, hydrogen, helium, or silicon used for a surface treatment.

9. The variable resistance memory device of claim 1, wherein each of a plurality of structures includes the first conductive line, the plurality of stacked structures, and the mold pattern,
the plurality of structures extend in a first direction, and
a filling insulation layer fills a space between the plurality of structures.

10. The variable resistance memory device of claim 1, further comprising:
a selection pattern on the middle electrode of each of the plurality of stacked structures; and
a second conductive line on the selection pattern, wherein the second conductive line extends in a direction perpendicular to an extending direction of the first conductive line.

11. A variable resistance memory device, comprising:
a plurality of stacked structures each including a lower electrode, a variable resistance pattern, and a middle electrode stacked on one another, wherein each of the plurality of stacked structures has a U-shape;
a mold pattern filling a space between the plurality of stacked structures; and
a selection pattern on the middle electrode of each of the plurality of stacked structures,
wherein an upper portion of the mold pattern includes a surface treated layer and a lower portion of the mold pattern include a non-surface treated layer.

12. The variable resistance memory device of claim 11, wherein the lower electrode has a U-shape, and the variable resistance pattern and the middle electrode are sequentially formed on each of uppermost surfaces of the lower electrode facing each other.

13. The variable resistance memory device of claim 11, wherein the upper portion of the mold pattern includes a first silicon nitride, and the lower portion of the mold pattern includes a second silicon nitride, and wherein the first silicon nitride has a hardness greater than a hardness of the second silicon nitride.

14. The variable resistance memory device of claim 11, wherein the upper portion of the mold pattern is opposite to at least portions of a sidewall of the middle electrode.

15. The variable resistance memory device of claim 11, wherein the upper portion of the mold pattern further includes argon, hydrogen, helium, or silicon used for a surface treatment.

16. The variable resistance memory device of claim 11, further comprising:
a substrate;
a plurality of first conductive lines extending in a first direction parallel with an upper surface of the substrate; and
a plurality of second conductive lines spaced apart from the plurality of first conductive lines in a direction perpendicular to the upper surface of the substrate, and extending in a second direction perpendicular to the first direction and parallel with the upper surface of the substrate,
wherein memory cells including the plurality of stacked structures and the selection pattern are disposed at cross points of the plurality of first conductive lines and the plurality of second conductive lines.

17. A variable resistance memory device, comprising:
a plurality of first conductive lines on a substrate, wherein each of the first conductive lines extends in a first direction parallel with an upper surface of the substrate;
a plurality of stacked structures on the plurality of first conductive lines, wherein each of the plurality of stacked structures includes a lower electrode, a variable resistance pattern, and a middle electrode stacked on one another;
a mold pattern on the plurality of first conductive lines to fill a space between the plurality of stacked structures, wherein an upper portion of the mold pattern includes a surface treated layer and a lower portion of the mold pattern includes a non-surface treated layer;
a selection pattern on the middle electrode of each of the plurality of stacked structures; and
a second conductive line on the selection pattern, and extending in a direction perpendicular to the first direction.

18. The variable resistance memory device of claim 17, wherein the lower electrode has a U-shape, and the variable resistance pattern and the middle electrode are sequentially formed on each of uppermost surfaces of the lower electrode facing each other.

19. The variable resistance memory device of claim 17, wherein the upper portion of the mold pattern includes a first silicon nitride, and the lower portion of the mold pattern includes a second silicon nitride, and wherein the first silicon nitride has a hardness greater than a hardness of the second silicon nitride.

20. The variable resistance memory device of claim 17, wherein the upper portion of the mold pattern further includes argon, hydrogen, helium, or silicon used for a surface treatment.

* * * * *